(12) United States Patent
St. Amand et al.

(10) Patent No.: US 8,129,824 B1
(45) Date of Patent: Mar. 6, 2012

(54) SHIELDING FOR A SEMICONDUCTOR PACKAGE

(75) Inventors: Roger D. St. Amand, Tempe, AZ (US);
Nozad O. Karim, Chandler, AZ (US);
Joseph M. Longo, Holly Springs, NC (US); Lee J. Smith, Chandler, AZ (US);
Robert F. Darveaux, Gilbert, AZ (US);
Jong Ok Chun, Chandler, AZ (US);
Jingkun Mao, Maricopa, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 570 days.

(21) Appl. No.: 12/327,716

(22) Filed: Dec. 3, 2008

(51) Int. Cl.
*H01L 27/10* (2006.01)

(52) U.S. Cl. . 257/659; 257/660; 257/686; 257/E23.114; 257/E23.006; 257/E23.013; 257/E25.021

(58) Field of Classification Search .................. 257/659, 257/660, 686, 777, E23.114, E25.006, E25.013, 257/E25.021
See application file for complete search history.

(56) References Cited

U.S. PATENT DOCUMENTS

| | | | |
|---|---|---|---|
| 4,925,024 A | 5/1990 | Ellenberger et al. | |
| 5,166,772 A | 11/1992 | Soldner et al. | |
| 5,416,358 A | 5/1995 | Ochi et al. | |
| 5,468,999 A | 11/1995 | Lin et al. | |
| 5,473,191 A | 12/1995 | Tanaka | |
| 5,557,142 A | 9/1996 | Gilmore et al. | |
| 5,614,694 A | 3/1997 | Gorenz, Jr. et al. | |
| 5,639,989 A | 6/1997 | Higgins, III | |
| 5,656,864 A | 8/1997 | Mitsue et al. | |
| 5,694,300 A | 12/1997 | Mattei et al. | |
| 5,907,477 A | 5/1999 | Tuttle et al. | |
| 5,940,271 A | 8/1999 | Mertol | |
| 6,136,131 A | 10/2000 | Sosnowski | |
| 6,194,655 B1 | 2/2001 | Lange, Sr. et al. | |
| 6,246,115 B1 | 6/2001 | Tang et al. | |
| 6,423,570 B1 | 7/2002 | Ma et al. | |
| 6,433,420 B1 | 8/2002 | Yang et al. | |
| 6,465,280 B1 | 10/2002 | Martin et al. | |
| 6,602,737 B2 | 8/2003 | Wu | |
| 6,686,649 B1 | 2/2004 | Mathews et al. | |
| 6,737,750 B1 * | 5/2004 | Hoffman et al. | 257/777 |
| 7,030,469 B2 | 4/2006 | Mahadevan et al. | |
| 7,768,135 B1 * | 8/2010 | St. Amand et al. | 257/777 |
| 2002/0089832 A1 | 7/2002 | Huang | |
| 2003/0067757 A1 | 4/2003 | Richardson et al. | |
| 2004/0195591 A1 * | 10/2004 | Gehman et al. | 257/202 |
| 2005/0006745 A1 * | 1/2005 | Nishimura | 257/686 |
| 2005/0280139 A1 | 12/2005 | Zhao et al. | |
| 2006/0063312 A1 * | 3/2006 | Kurita | 438/127 |
| 2006/0097402 A1 * | 5/2006 | Pu et al. | 257/777 |
| 2007/0030661 A1 | 2/2007 | Morris et al. | |
| 2007/0096335 A1 * | 5/2007 | Kwon et al. | 257/777 |

* cited by examiner

*Primary Examiner* — Eugene Lee
*Assistant Examiner* — Peniel M Gumedzoe
(74) *Attorney, Agent, or Firm* — Weiss & Moy, P.C.; Jeffrey D. Moy

(57) ABSTRACT

A semiconductor device has a substrate. A first die is electrically attached to a first surface of the substrate. A shield spacer having a first and second surface is provided wherein the second surface of the shield spacer is attached to a first surface of the first die. A plurality of wirebonds are attached to the shield spacer and to the substrate. A mold compound is provided for encapsulating the first die, the shield spacer, and the wirebonds.

21 Claims, 10 Drawing Sheets

SHIELDING FOR A SEMICONDUCTOR PACKAGE

FIELD OF THE INVENTION

This invention relates to Radio Frequency (RF) shielding and, more specifically, to a system and method for providing compartmental RF shielding in a semiconductor package that lessens the footprint and/or profile of semiconductor packages of prior art solutions.

BACKGROUND OF THE INVENTION

Radio Frequency (RF) shielding may be required on certain semiconductor devices and modules (hereinafter semiconductor device) in order to minimize Electro-Magnetic Interference (EMI) radiation from the semiconductor device. RF shielding is further required to prevent RF radiation from external sources from interfering with operation of the semiconductor device. In a semiconductor device which integrates multiple functions/modules (front end module (FEM)+transmitter, radio+baseband, etc.) compartmental shielding may be required to minimize EMI radiation from the different components/modules and to prevent RF radiation from interfering with operation of the different components/modules in the semiconductor device.

Presently, there are several different methods used for compartmental shielding of semiconductor devices which integrates multiple functions/modules. Known methods of compartmental shielding include embedded shields, metal cans with compartmental features, wire fences, and laser ablated vias. All of the above approaches are designed for side by side solutions for compartmental shielding. Side by side solutions require additional space and thus increase the footprint of the semiconductor package.

Therefore, a need existed to provide a system and method to overcome the above problem. The system and method would provide for compartmental RF shielding of a semiconductor device which lessens the footprint and/or profile of prior art semiconductor devices.

SUMMARY OF THE INVENTION

A semiconductor device has a substrate. A first die is electrically attached to a first surface of the substrate. A shield spacer having a first and second surface is provided wherein the second surface of the shield spacer is attached to a first surface of the first die. A plurality of wirebonds is attached to the shield spacer and to the substrate. A mold compound is provided for encapsulating the first die, the shield spacer, and the wirebonds.

A semiconductor device has a substrate. A first die is electrically attached to a first surface of the substrate. A metal layer is applied to a first surface of the first die. A first plurality of wirebonds is attached to the metal layer and to the substrate. A mold compound is provided for encapsulating the first die, the metal layer, and the first plurality of wirebonds.

A semiconductor device has a substrate. A die is electrically attached to a the substrate. A plurality of wirebonds are attached to the substrate and extend over a first surface of the die. A mold compound is provided for encapsulating the die and the wirebonds.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
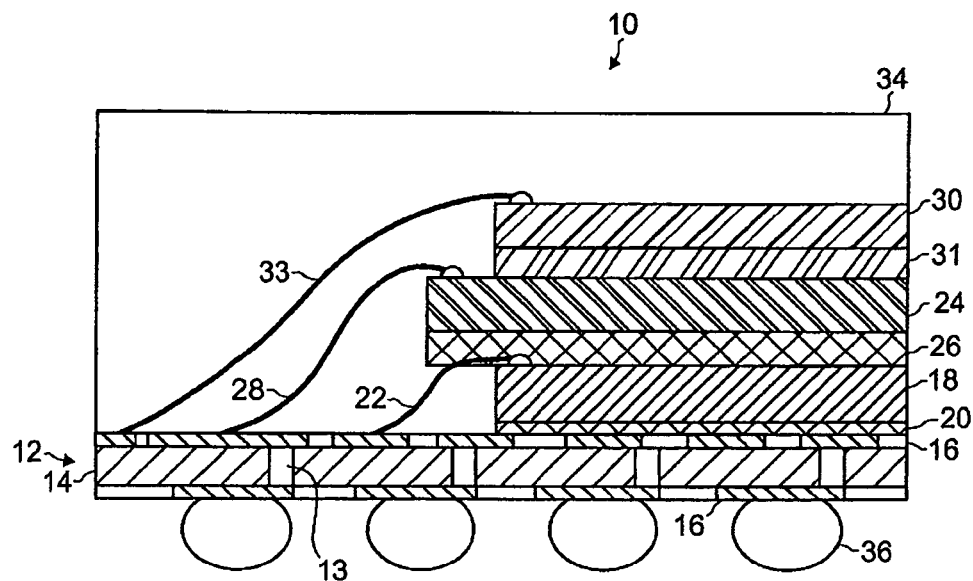
FIG. 1 is a cross-sectional side view of one embodiment of the semiconductor device of the present invention.
Figure 1A:
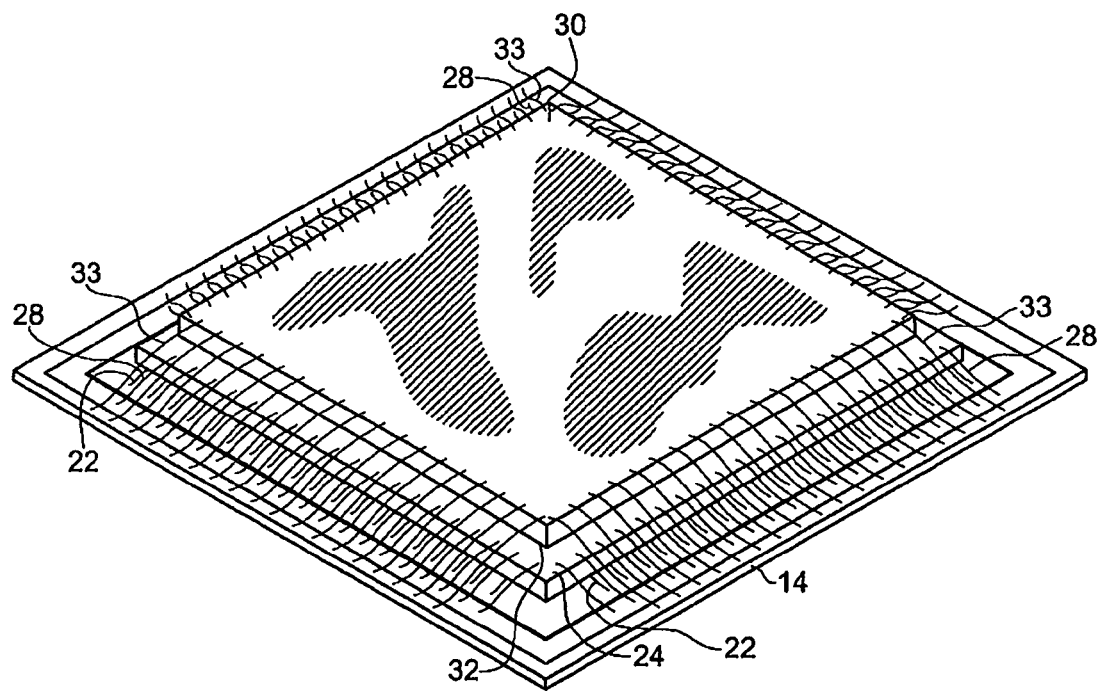
FIG. 1A is an elevated perspective view of the embodiment depicted in FIG. 1.

Referring to FIGS. 1 and 1A, a semiconductor device 10 (hereinafter device 10) is shown. The device 10 provides compartmental shielding which lessens the footprint and/or profile of prior art semiconductor devices.

The device 10 has a substrate 12. The substrate 12 may be any one chosen from a conventional rigid PCB, a flexible PCB, and an equivalent thereof, but the kind of first substrate 12 is not limited herein. The substrate 12 includes an insulation layer 14 having predetermined area and thickness. The insulation layer 14 has an approximately planar first surface and an approximately planar second surface opposing the first surface. The insulation layer 14 will have one or more metal traces 16 formed thereon. In the embodiment shown in FIGS. 1 and 1A, the insulation layer 14 has metal traces 16 formed on the first and second surface of the insulation layer 14. The number of metal traces 16 is not limited to the number shown in the FIGS. 1 and 1A. In general, the insulation layer 14 will have multiple layers of metal traces 16 formed therein. If multiple layers of metal traces 16 are formed in the insulation layer 14, a dielectric layer is generally applied between the layers of metal traces 16. The dielectric layer is used as an insulating layer to separate the layers of metal traces 16. Metal filled vias 13 are used to mechanically and electrically connect the layers of metal traces 16. A soldermask may be placed over the top surface of the metal traces 16 to protect the metal traces 16.

A die 18 is attached to the substrate 12. The die 18 may be an RF die, a memory die, a logic die, an ASIC die, and other like elements. It should be noted that the listing of the above types of dies is given as an example and should not be seen as to limit the scope of the present invention. The die 18 will have an approximately planar first surface and an approximately planar second surface opposing the first surface. The die 18 may be coupled to the substrate 12 in a plurality of different manners. In the embodiment shown in FIG. 1, an adhesive 20 is used to couple the second surface of the die 18 to the first surface of the substrate 12. The adhesive 20 may be an adhesive film, an epoxy, or the like. The listing of the above adhesive types should not be seen as to limit the scope of the present invention. The die 18 is then electrically coupled to the substrate 12. In the present embodiment, wirebonds 22 are used to electrically couple the die 18 to the substrate 12. The wirebond 22 will form an electrical connection between a bond pad formed as part of metal trace 16 on the first surface of the substrate 12 and a bond pad formed on the first surface of the die 18. Alternatively, the die 18 may be coupled to the substrate 12 through flip chip bonding, surface mount technology (SMT) or the like.

A spacer 24 is then attached to the first surface of the die 18. The spacer 24 may be a metalized spacer, a silicon spacer, or the like. If the spacer 24 is a metalized spacer, the spacer 24 may be formed of different metal materials such as Al, Al/Si, or the like. The listing of the above is given as examples and should not be seen as to limit the scope of the present invention. In the embodiment depicted in FIGS. 1 and 1A, the spacer 24 is longer than the die 18. Thus, the spacer 24 will extend past both side surfaces of the die 18, the side surfaces being adjacent and approximately perpendicular to the first surface and second surface of the die 18. The spacer 24 is attached to the first surface of the die 18 using an adhesive. The adhesive may be an adhesive film, an epoxy, or the like. In the present embodiment, the spacer 24 needs to be attached to the first surface of the die 18 so that the spacer 24 does not come into contact with the wirebonds 22. Thus, the adhesive used to attach the second surface of the spacer 24 to the first surface of the die 18 needs to be thicker than the loop height of the wirebonds 22.

In accordance with one embodiment of the present invention, a film on wire technology is used to attach the spacer 24 to the first surface of the die 18. In film on wire technology, an adhesive film 26 having a thickness greater then the loop height of the wirebonds 22 is attached to the second surface of the spacer 24. In accordance with one embodiment of the present invention, the adhesive film 26 will have a thickness of approximately 60 μm. The surface to which the spacer 24 is to be attached needs to be heated. In general, a substrate strip from which device 10 is formed is heated which in turn heats up the first surface of the die 18 and the associated wirebonds 22. The second surface of the spacer 24 having the adhesive film 26 is then placed on top of the first surface of the die 18. As the adhesive film 26 comes in contacted with the heated wirebond 22, the adhesive film 26 will melt and flow around the wirebond 22. The device 10 will then go through a curing process to harden and eliminate any voids in the adhesive film 26.

As an alternative to the film on wire technology using the adhesive film 26, a second spacer may be positioned between the spacer 24 and the die 18. The second spacer would have a smaller surface area and positioned in the center of the die 18 so as to not touch the wirebonds 22 and be of sufficient height so that the spacer 24 does not come into contact with the wirebonds 22. An adhesive such as an adhesive film, an epoxy, or the like is used to attach the second spacer to both the die 18 and the spacer 24.

A second set of wirebonds 28 are positioned around the perimeter of the spacer 24 and connects the spacer 24 to the first surface of the substrate 12. In the embodiment shown in FIGS. 1 and 1A, the wirebonds 28 are attached to the first surface of the spacer 24 and to a metal trace 16 formed on the first surface of the insulation layer 14 of the substrate 12. In general, the wirebonds 28 are attached to the first surface of the spacer 24 and to a metal trace 16 via bond pads.

The metal trace 16 to which the wirebonds 28 are attached is a ground pad thereby grounding the spacer 24. The wirebonds 28 positioned around the perimeter of the grounded spacer 24 and attached to the grounded metal trace 16 isolates and forms an RF shield around the die 18. The number, pitch and diameter of the wirebonds 28 may be changed to alter the shielding effect. Thus, the number of wirebonds 28, spacing between wirebonds 28 and/or diameter of the wirebonds 28 may be increased to provide greater shielding coverage and may be lessened for devices that require less shielding.

A second die 30 may be coupled to the first surface of the metalized spacer 24. The second die 30 may be a memory die, a logic die, an ASIC die, and other like elements. It should be noted that the listing of the above types of dies is given as an example and should not be seen as to limit the scope of the present invention. The second die 30 will have an approximately planar first surface and an approximately planar second surface opposing the first surface. The second die 30 is generally attached to the first surface of the spacer 24 using an adhesive 31. The adhesive 31 may be an adhesive film, an epoxy, or the like. The second die 30 is positioned on the surface of the spacer 24 so as to not touch the wirebonds 28. In the embodiment depicted in FIGS. 1 and 1A, the length of the second die 30 is smaller than the length of the spacer 24. Thus, by positioning and attaching the second die 30 to a central area of the first surface of the spacer 24, the die 30 will not contact the wirebonds 28. The second die 30 is then electrically connected to the substrate 12. As shown in FIGS. 1 and 1A, wirebonds 33 are used to electrically connect the second die 30 to metal traces 16 formed on the first surface of the substrate 12.

A mold compound 34 is used to encapsulate the device 10. The mold compound 34 is mainly made of non-conductive paste, film, or the like. The mold compound 34 is used to encapsulate the exposed surfaces of the dies 18 and 30; wirebonds 22, 28, and 33; the metalized spacer 24, and the first surface of the substrate 12.

A set of contacts 36 may be coupled to the second surface of the substrate 12. In the embodiment shown in FIGS. 1 and 1A, the contacts 36 are solder balls. If solder balls are used, the solder balls will be electrically coupled to the second surface of the substrate 12 via bond pads. In general, a reflow process may be used to couple the solder balls to the second surface of the substrate 12. Alternative methods may be used to couple different types of contacts to the first substrate 12 without departing from the spirit and scope of the present invention.

Figure 2:
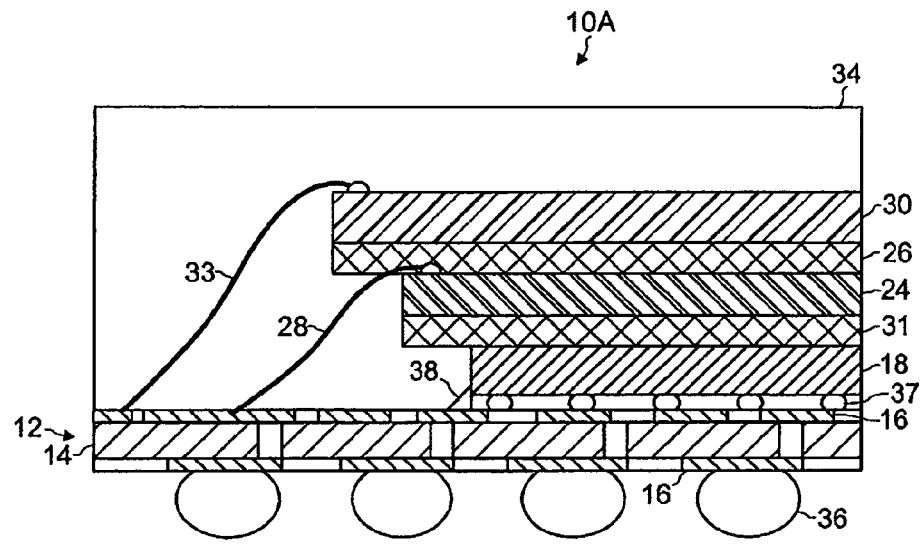
FIG. 2 is a cross-sectional view of another embodiment of the semiconductor device of the present invention.
Figure 2A:
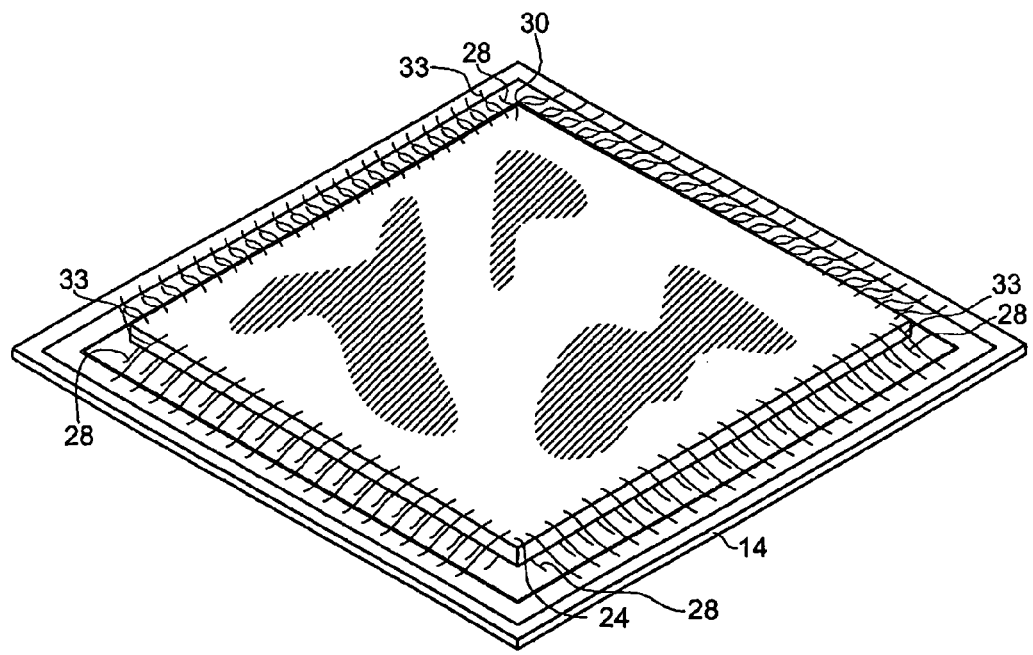
FIG. 2A is an elevated perspective view of the embodiment depicted in FIG. 2.

Referring to FIGS. 2 and 2A, another embodiment of the device 10A is shown. In this embodiment, the device 10A is similar to device 10 of FIG. 1. The device 10A has a substrate 12 having one or more metal traces 16 formed in the insulation layer 14 of the substrate 12.

In device 10A, the die 18 is electrically connected to the first surface of the substrate 12 through the use of flip chip technology. The die 18 will have a plurality of contacts 37 attached to the second surface of the die 18. The contacts 37 are attached to the metal traces 16 formed on the first surface of the substrate 12 thereby electrically connecting the die 18 to the first surface of the substrate 12. In the present embodiment, the contacts 37 are solder bumps. The contacts 37 are generally connected to the die 18 and metal traces 16 through the use of bond pads. A reflow process may be used to couple the solder bumps to the bond pads on the dies 18 and the metal traces 16.

The process of flip chip mounting generally leaves spaces between the first surface of the substrate 12 and the second surface of the die 18. An underfill 38 is generally used to fill the gap between the second surface of the die 18 and the first surface of the substrate 12. The underfill 38 increases the fatigue life of the device 10A and improves the reliability of the electrical connections by reducing the stress experienced by the contacts 37 during thermal cycling or when the die 18 and the device 10A have a significant temperature differential. The underfill 38 also isolates the contacts 37 from exposure to the ambient environment by hermetically sealing the gap and lends mechanical strength. The underfill 38 may be the same or different than the encapsulating mold compound 34.

The spacer 24 is then attached to the first surface of the die 18 using an adhesive 31. Any type of adhesive may be used. In the present embodiment shown, the adhesive is an adhesive film 31. However, this should not be seen as to limit the scope of the present invention as any type of adhesive may be used. Since there are no wirebonds used to electrically couple the die 18 to the substrate 12, there are no restrictions as to the height of the adhesive film 31. As shown specifically in FIG. 2, the adhesive film 31 is generally applied on the entire bottom surface of the spacer 24.

The wirebonds 28 are positioned around the perimeter of the spacer 24 and connects the spacer 24 to the first surface of the substrate 12. In the embodiment shown in FIG. 2, the wirebonds 28 are attached to the first surface of the spacer 24 and to a metal trace 16 formed on the first surface of the insulation layer 14 of the substrate 12. In general, the wirebonds 28 are attached to the first surface of the metalized spacer 24 and to a metal trace 16 via bond pads.

The metal trace 16 to which the wirebonds 28 are attached is a ground pad thereby grounding the spacer 24. The wirebonds 28 positioned around the perimeter of the grounded spacer 24 and attached to the grounded metal trace 16 isolate and form an RF shield around the die 18. The number, pitch and diameter of the wirebonds 28 may be changed to alter the shielding effect. Thus, the number of wirebonds 28, spacing between wirebonds 28 and/or diameter of the wirebonds 28 may be increased to provide greater shielding coverage and lessened for devices that require less shielding.

The device 10A may have a second die 30 attached to the first surface of the spacer 24A using an adhesive. The second die 30 is positioned on the surface of the spacer 24 so as to not touch the wirebonds 28. If the length of the second die 30 is smaller than the length of the spacer 24, the second die 30 may be positioned and attached to a central area of the first surface of the spacer 24 so as to not come into contact with the wirebonds 28. However, in FIG. 2, the second die 30 is larger than the spacer 24. Thus, the second die 30 will extend past both side surfaces of the spacer 24. Thus, the adhesive used to attach the second surface of the second die 30 to the first surface of the spacer 24 needs to be thicker than the loop height of the wirebonds 28.

In accordance with one embodiment of the present invention, a film on wire technology is used to attach the second surface of the second die 30 to the first surface of the spacer 24. In film on wire technology, an adhesive film 26 having a thickness greater then the loop height of the wirebonds 28 is attached to the second surface of the second die 30. In accordance with one embodiment of the present invention, the adhesive film 26 will have a thickness of approximately 60 µm is used. The surface to which the second die 30 is to be attached is heated which in turns heats the associated wires of the wirebonds 28. The second surface of the second die 30 having the adhesive film 26 is then placed on top of the first surface of the spacer 24. As the adhesive film 26 comes in contacted with the heated wire of the wirebonds 28, the adhesive film 26 will melt and flow around the wire of the wirebonds 28. The device 10A will then go through a curing process to harden and eliminate any voids in the adhesive film 26.

As an alternative to the film on wire technology using the adhesive film 26, a second spacer may be positioned between the spacer 24 and the second die 30. The second spacer would have a smaller surface area and positioned in the center area of the spacer 24 so as to not touch the wirebonds 28 and be of sufficient height so that the second die 30 does not come into contact with the wirebonds 28. An adhesive such as an adhesive film, an epoxy, or the like is used to attach the second spacer to both the second die 30 and the spacer 24.

The second die 30 is then electrically connected to the substrate 12. As shown in FIG. 2, wirebonds 33 are used to electrically connect the second die 30 to metal traces 16 formed on the first surface of the substrate 12. In general, the wirebonds 33 are attached to the first surface of the second die 30 and to the metal trace 16 via bond pads.

The mold compound 34 is used to encapsulate the device 10A. The mold compound 34 is used to encapsulate the exposed surfaces of the dies 18 and 30; wirebonds 22, 28, and 33; the metalized spacer 24, and the first surface of the substrate 12.

Contacts 36 may be coupled to the second surface of the substrate 12. In the embodiment shown in FIG. 2, the contacts 36 are solder balls. If solder balls are used, the solder balls will be electrically coupled to the second surface of the substrate 12.

Figure 3:
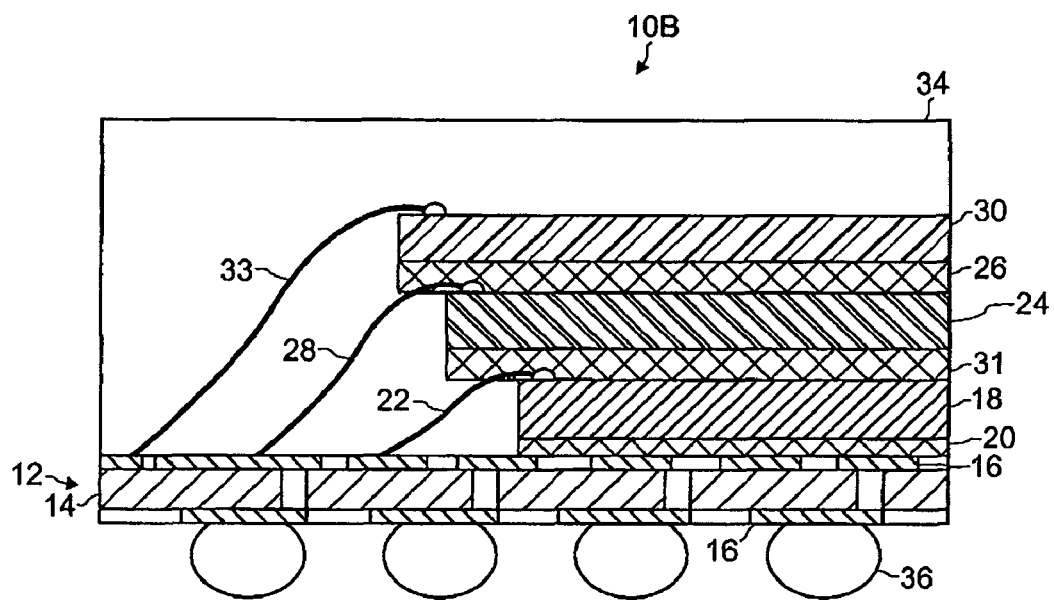
FIG. 3 is a cross-sectional view of another embodiment of the semiconductor device of the present invention.

Referring to FIG. 3, another embodiment of the device 10B is shown. In this embodiment, the device 10B is similar to device 10 of FIG. 1. The device 10B has a substrate 12 having one or more metal traces 16 formed in the insulation layer 14 of the substrate 12. The die 18 is attached to the substrate 12. In the embodiment shown in FIG. 3, an adhesive 20 is used to couple the second surface of the die 18 to the first surface of the substrate 12. The die 18 is then electrically coupled to the substrate 12 using wirebonds 22. The wirebonds 22 will form an electrical connection between a bond pad formed on the first surface of the die 18 and metal traces 16 formed on the first surface of the substrate 12. Alternatively, the die 18 may be coupled to the substrate 12 through flip chip bonding, surface mount technology (SMT) or the like.

The spacer 24 is then attached to the first surface of the die 18. In the embodiment, the spacer 24 is longer than the die 18. Thus, the spacer 24 will extend past both side surfaces of the die 18, the side surfaces being adjacent and approximately perpendicular to the first surface and second surface of the die 18. The spacer 24 is generally attached to the first surface of the die 18 using an adhesive.

The spacer 24 needs to be attached to the first surface of the die 18 so that the spacer 24 does not come into contact with the wirebonds 22. Thus, the adhesive used to attach the second surface of the spacer 24 to the first surface of the die 18 needs to be thicker than the loop height of the wirebonds 22. In accordance with one embodiment of the present invention, a film on wire technology using an adhesive film 26 is used to attach the spacer 24 to the first surface of the die 18.

As an alternative to the film on wire technology using the adhesive film 26, a second spacer may be positioned between the spacer 24 and the die 18. The second spacer would have a smaller surface area and positioned in a center area of the die 18 so as to not touch the wirebonds 22 and be of sufficient height so that the spacer 24 does not come into contact with the wirebonds 22. An adhesive such as an adhesive film, an epoxy, or the like is used to attach the second spacer to both the die 18 and the spacer 24.

The wirebonds 28 are positioned around the perimeter of the spacer 24 and connects the spacer 24 to the first surface of the substrate 12. In the embodiment shown in FIG. 3, the wirebonds 28 are attached to the first surface of the spacer 24 and to a metal trace 16 formed on the first surface of the insulation layer 14 of the substrate 12. In general, the wirebonds 28 are attached to the first surface of the spacer 24 and to a metal trace 16 via bond pads.

The metal trace 16 to which the wirebonds 28 are attached is a ground pad thereby grounding the spacer 24. The wirebonds 28 positioned around the perimeter of the grounded spacer 24 and attached to the grounded metal trace 16 isolates and forms an RF shield around the die 18. The number, pitch and diameter of the wirebonds 28 may be changed to alter the shielding effect. Thus, the number of wirebonds 28, spacing between wirebonds 28 and/or diameter of the wirebonds 28 may be increased to provide greater shielding coverage and lessened for devices that require less shielding.

A second die 30 may be coupled to the first surface of the spacer 24. In the present embodiment, the second die 30 is larger than the spacer 24. Thus, the second die 30 will extend past both side surfaces of the spacer 24. Thus, the adhesive used to attach the second surface of the second die 30 to the first surface of the spacer 24 needs to be thicker than the loop height of the wirebonds 28. In accordance with one embodiment of the present invention, a film on wire technology is used to attach the second surface of the second die 30 to the first surface of the spacer 24. In film on wire technology, an adhesive film 26 having a thickness greater then the loop height of the wirebonds 28 is attached to the second surface of the second die 30. In accordance with one embodiment of the present invention, the adhesive film 26 will have a thickness of approximately 60 µm is used. The surface to which the second die 30 is to be attached is heated which in turns heats the associated wires of the wirebonds 28. The second surface of the second die 30 having the adhesive film 26 is then placed on top of the first surface of the spacer 24. As the adhesive film 26 comes in contacted with the heated wire of the wirebond 28, the adhesive film 26 will melt and flow around the wire of the wirebond 28. The device 10 will then go through a curing process to harden and eliminate any voids in the adhesive film 26.

As an alternative to the film on wire technology using the adhesive film 26, a second spacer may be positioned between the spacer 24 and the second die 30. The second spacer would have a smaller surface area and positioned in a center area of the spacer 24 so as to not touch the wirebonds 28 and be of sufficient height so that the spacer 24 does not come into contact with the wirebonds 28. An adhesive such as an adhesive film, an epoxy, or the like is used to attach the second spacer to both the second die 30 and the spacer 24.

The second die 30 is then electrically connected to the substrate 12. As shown in FIG. 3, wirebonds 33 are used to electrically connect the second die 30 to metal traces 16 formed on the first surface of the substrate 12. In general, the wirebonds 33 are attached to the first surface of the second die 30 and to the metal trace 16 via bond pads.

A mold compound 34 is used to encapsulate the device 10B. The mold compound 34 is used to encapsulate the exposed surfaces of the dies 18 and 30; wirebonds 22, 28, and 33; the metalized spacer 24, and the first surface of the substrate 12.

A set of contacts 36 may be coupled to the second surface of the substrate 12. In the embodiment shown in FIG. 3, the contacts 36 are solder balls. If solder balls are used, the solder balls will be electrically coupled to the second surface of the substrate 12. In general, a reflow process may be used to couple the solder balls to the second surface of the substrate 12. Alternative methods may be used to couple different types of contacts to the first substrate 12 without departing from the spirit and scope of the present invention.

Figure 4:
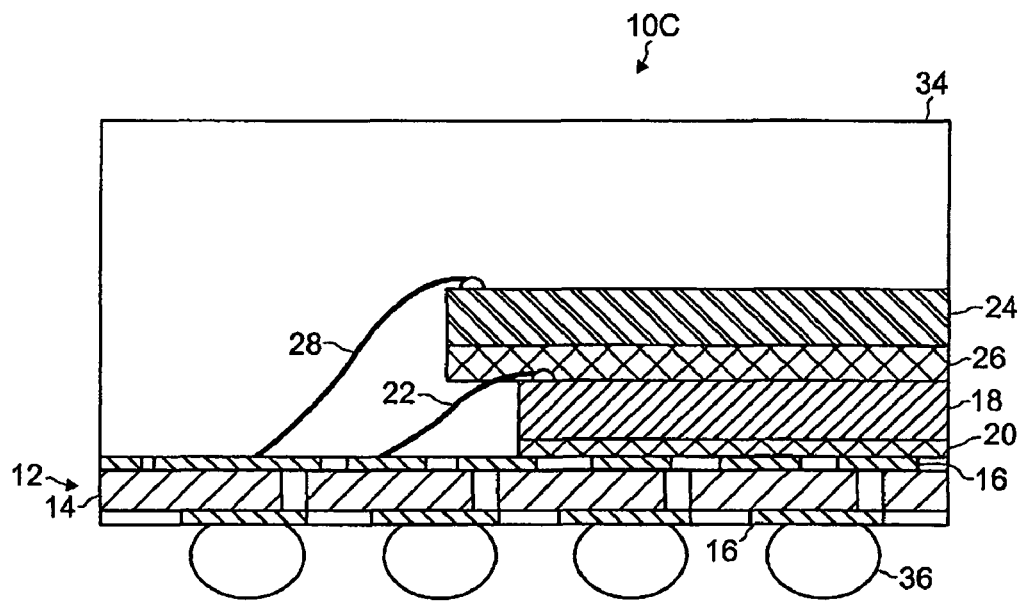
FIG. 4 is a cross-sectional view of another embodiment of the semiconductor device of the present invention.

Referring to FIG. 4, another embodiment of the device 10C is shown. In this embodiment, the device 10C is the same as the device 10 of FIG. 1. However, in device 10C, the second die 30 is not attached to the first surface of the spacer 24.

Figure 5:
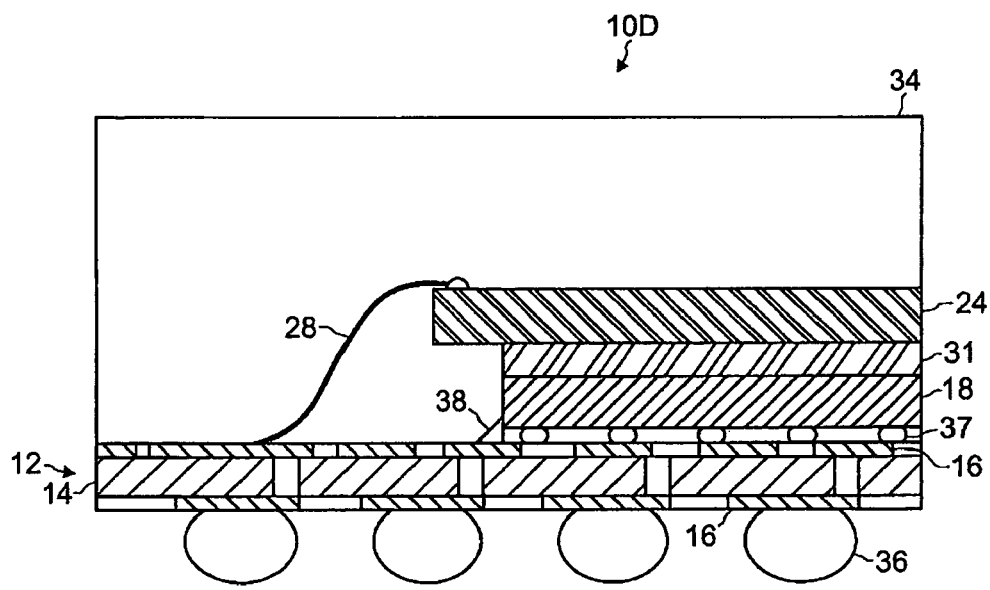
FIG. 5 is a cross-sectional view of another embodiment of the semiconductor device of the present invention.

Referring to FIG. 5, another embodiment of the device 10D is shown. In this embodiment, the device 10D is the same as the device 10A. However, in device 10D, the second die 30 is not attached to the first surface of the metalized spacer 24A.

Figure 6:
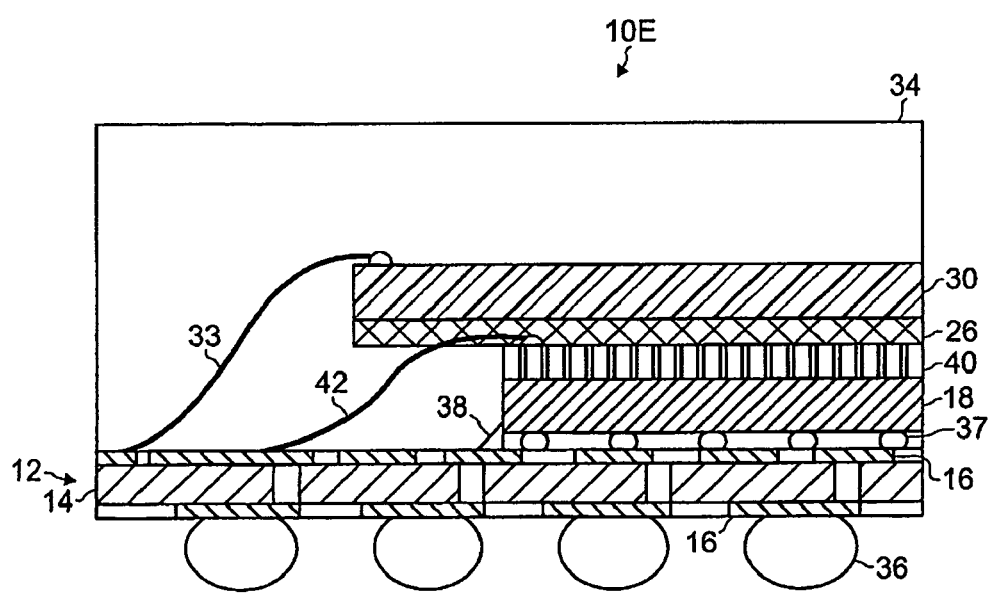
FIG. 6 is a cross-sectional view of another embodiment of the semiconductor device of the present invention.

Referring to FIG. 6, another embodiment of the device 10E is shown. In this embodiment, the device 10E has a substrate 12. The substrate 12 includes an insulation layer 14 having predetermined area and thickness. The insulation layer 14 will have one or more metal traces 16 formed thereon. The number of metal traces 16 is not limited to the number shown in FIG. 6. In general, the insulation layer 14 will have multiple layers of metal traces 16 formed therein.

A die 18 is attached to the substrate 12. The die 18 may be an RF die, a memory die, a logic die, an ASIC die, and other like elements. In device 10E, the die 18 is electrically connected to the first surface of the substrate 12 through the use of flip chip technology. The die 18 will have a plurality of contacts 37 attached to the second surface of the die 18. The die 18 is then electrically coupled to the metal traces 16 formed on the first surface of the substrate 12 via the contacts 37. In the present embodiment, the contacts 37 are solder bumps. The contacts 37 are generally connected to the die 18 and the metal traces 16 through the use of bond pads. A reflow process may be used to couple the solder balls to the bond pads. An underfill 38 may be used to fill the gap between the second surface of the die 18 and the first surface of the substrate 12.

In the present embodiment, a metal coating 40 is applied to the first surface of the die 18. The metal coating 40 may be formed of different metal materials such as Cu, Al or the like. The listing of the above is given as examples and should not be seen as to limit the scope of the present invention.

Wirebonds 42 are used to attach the metal coating 40 to the metal traces 16 formed on the first surface of the substrate 12. The wirebonds 42 are positioned around the perimeter of the metal coating 40 and connects the metal coating 40 to the metal traces 16. In general, the wirebonds 42 are attached to the first surface of the metal coating 40 and to a metal trace 16 via bond pads. The metal trace 16 to which the wirebonds 42 is attached is a ground pad thereby grounding the metal coating 40. The wirebonds 42 positioned around the perimeter of the grounded metal coating 40 and attached to the grounded metal trace 16 isolates and forms an RF shield around the die 18. The number, pitch and diameter of the wirebonds 42 may be changed to alter the shielding effect. Thus, the number of wirebonds 42, the spacing between wirebonds 42 and/or diameter of the wirebonds 42 may be increased to provide greater shielding coverage and lessened for devices that require less shielding.

The second die 30 may be coupled to the metal coating 40. The second die 30 is attached to the metal coating 40 using an adhesive. The adhesive may be an adhesive film, an epoxy, or the like. The second die 30 is positioned on the surface of the metal coating 40 so as to not touch the wirebonds 42. If the length of the second die 30 is smaller than the length of the first die 18, one may position and attach the second die 30 to a central area of the first surface of the first die 30 so that the second die 30 will not contact the wirebonds 42. In FIG. 6, the length of the second die 30 is larger than the length of the first die 18. The second die 30 will extend past both side surfaces of the first die 18. Thus, the adhesive used to attach the second surface of the second die 30 to the metal coating 40 needs to be thicker than the loop height of the wirebonds 42. In accordance with one embodiment of the present invention, a film on wire technology using and adhesive film 26 is used to attach the second surface of the second die 30 to the first surface of the metal coating 40.

The second die 30 is then electrically connected to the substrate 12. As shown in FIG. 6, wirebonds 33 are used to electrically connect the second die 30 to metal traces 16 formed on the first surface of the substrate 12. The wirebonds 33 are generally attached to the first surface of the second die 30 and to a metal trace 16 via bond pads.

A mold compound 34 is used to encapsulate the device 10E. The mold compound 34 is used to encapsulate the exposed surfaces of the dies 18 and 30, wirebonds 33 and 42, the metal coating 40, and the first surface of the substrate 12.

A set of contacts 36 may be coupled to the second surface of the substrate 12. In the embodiment shown in FIG. 6, the contacts 36 are solder balls. If solder balls are used, the solder balls will be electrically coupled to the second surface of the substrate 12. In general, a reflow process may be used to couple the solder balls to the second surface of the substrate 12. Alternative methods may be used to couple different types of contacts to the first substrate 12 without departing from the spirit and scope of the present invention.

Figure 7A:
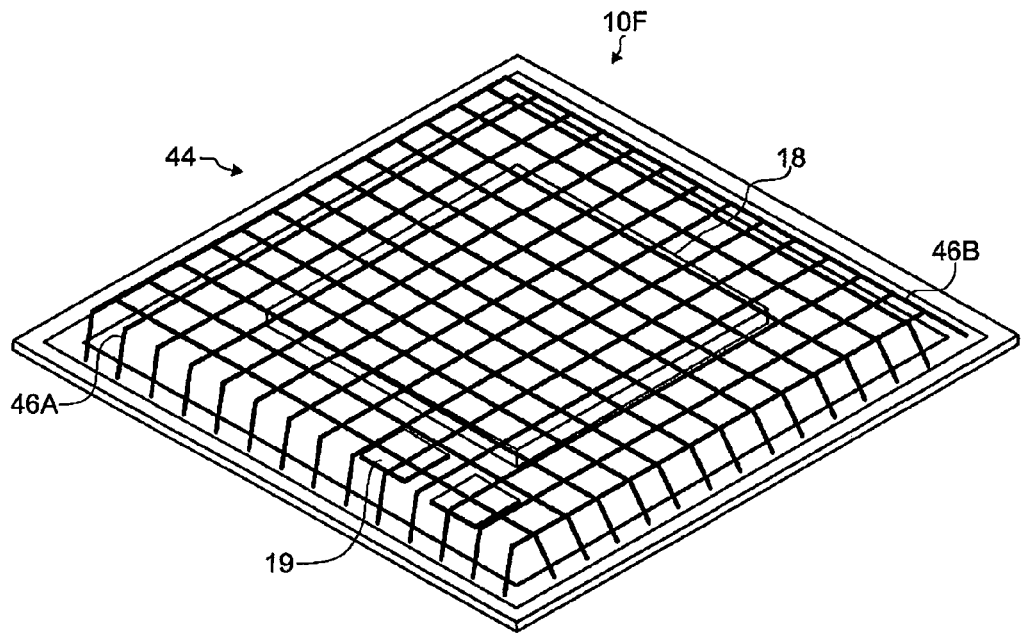
FIG. 7A is an elevated perspective view of another embodiment of the semiconductor device of the present invention.
Figure 7B:
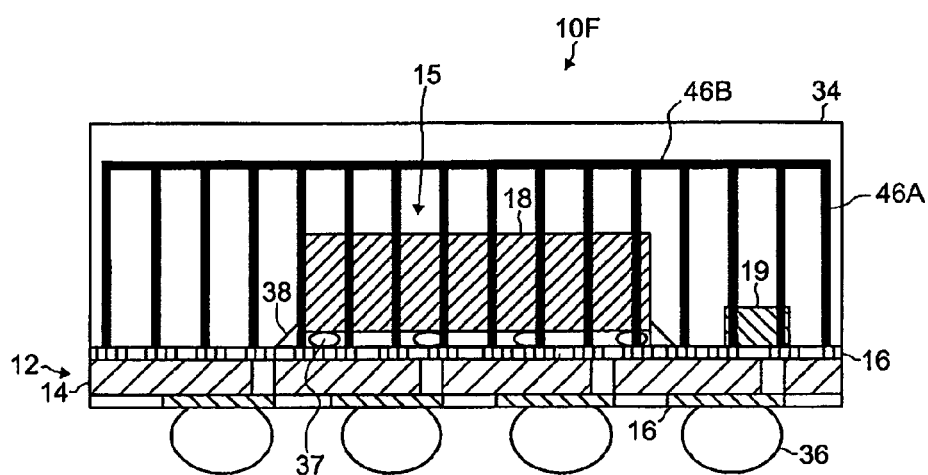
FIG. 7B is a cross-sectional view of another embodiment of the semiconductor device of the present invention.

Referring to FIGS. 7A-7B, another embodiment of the device 10F is shown. The device 10F has a substrate 12 having one or more metal traces 16 formed in the insulation layer 14 of the substrate 12. One or more components 15 are electrically connected to the first surface of the substrate 12. The components 15 may be a die 18 and/or one or more passive components 19. In the present embodiment, the die 18 is electrically connected to the first surface of the substrate 12 via flip chip technology. Thus, the die 18 will have a plurality of contacts 37 attached to the second surface of the die 18. The contacts 37 are attached to the metal traces 16 formed on the first surface of the substrate 12 thereby electrically connecting the die 18 to the first surface of the substrate 12. In the present embodiment, the contacts 37 are solder bumps. The contacts 37 are generally connected to the die 18 and metal traces 16 through the use of bond pads. A reflow process may be used to couple the solder balls to the bond pads and hence the metal traces 16 formed on the first surface of the substrate 12 and the die 18. Alternatively, the die 18 may be electrically connected to the first surface of the substrate 12 via wirebonds.

In the present embodiment since the die 18 is electrically connected to the first surface of the substrate 12 via flip chip technology, an underfill 38 is used to fill the gap between the second surface of the die 18 and the first surface of the substrate 12. The underfill 38 increases the fatigue life of the device 10F and improves the reliability of the electrical connections by reducing the stress experienced by the contacts 37 during thermal cycling or when the die 18 and the device 10F have a significant temperature differential. The underfill 38 also isolates the contacts 38 from exposure to the ambient environment by hermetically sealing the gap and lends mechanical strength. The underfill 38 may be the same or different than the encapsulating mold compound 34.

A wire mesh 44 is formed to enclose the die 18 and the one or more passive components 19. The wire mesh 44 is used to provide an RF shield over the die 18 and the passive components 19. The wire mesh 44 provides a lower profile than existing methods and further has a reduced cost.

The wire mesh 44 is formed of a plurality of metal wires. The metal wires may be made of gold, copper, or the like. The listing of the above is only given as an example and should not be seen as to limit the scope of the present invention. Each metal wire will extend across either the entire length or width of the die 18 and the passive components 19. Each end of each wire 46 will be coupled to a metal trace 16 which is grounded thereby creating the wire mesh 44.

As shown in FIGS. 7A and 7B, a first set of wires 46A has a first end attached to a metal trace 16 on a first side of the device 10F. The wire 46A extends widthwise over the device 10F to a second side of the device 10F where a second end of the wire 46A is attached to another metal trace 16. In a like manner, a second set of wires 46B has a first end attached to a metal trace 16 on a third side of the device 10F. The wire 46B extends lengthwise over the device 10F to a fourth side of the device 10F where the second end of the wire 46B is attached to another metal trace 16. By adjusting the number of wires 46, pitch of the wires 46 and/or diameter of the wires 46, one may alter the shielding effect.

The wire mesh 44 will generally be formed through a wirebonding process. By adjusting the tension of the wire 46 during the looping process, one may adjust the shape of the wire 46 and hence the shape of the wire mesh 44. The shape of the wire during the wirebonding process will generally be dictated by the length of the wire run.

A mold compound 34 is used to encapsulate the device 10F. The mold compound 34 is used to encapsulate the exposed surfaces of the dies 18, wire mesh 44, and the first and side surfaces of the substrate 12.

Contacts 36 may be coupled to the second surface of the substrate 12. In the embodiment shown in FIG. 7B, the contacts 36 are solder balls. If solder balls are used, the solder balls will be electrically coupled to the second surface of the substrate 12.

Figure 8A:
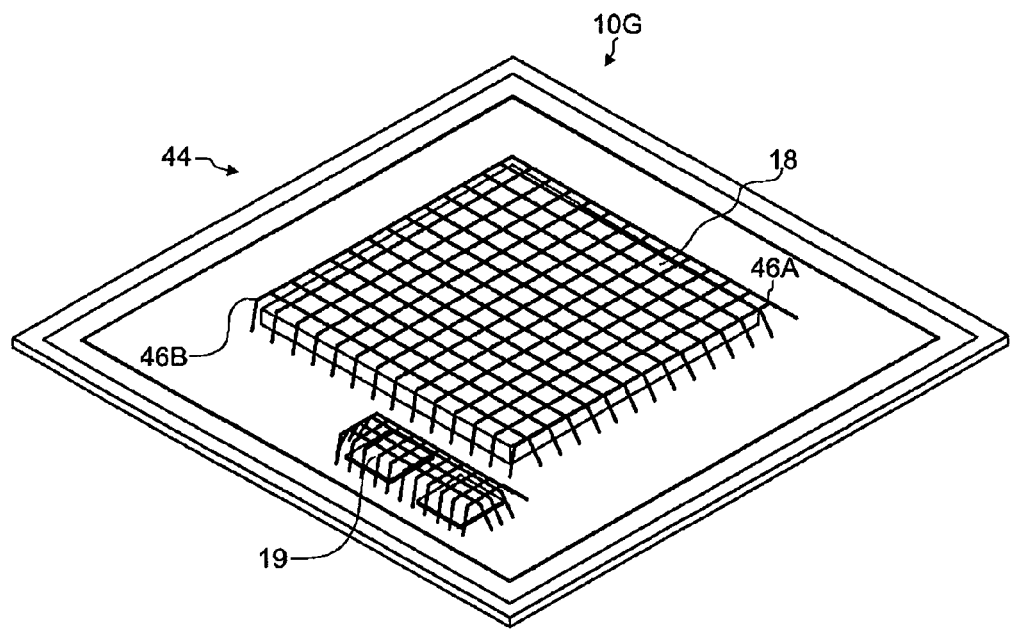
FIG. 8A is an elevated perspective view of another embodiment of the semiconductor device of the present invention.
Figure 8B:
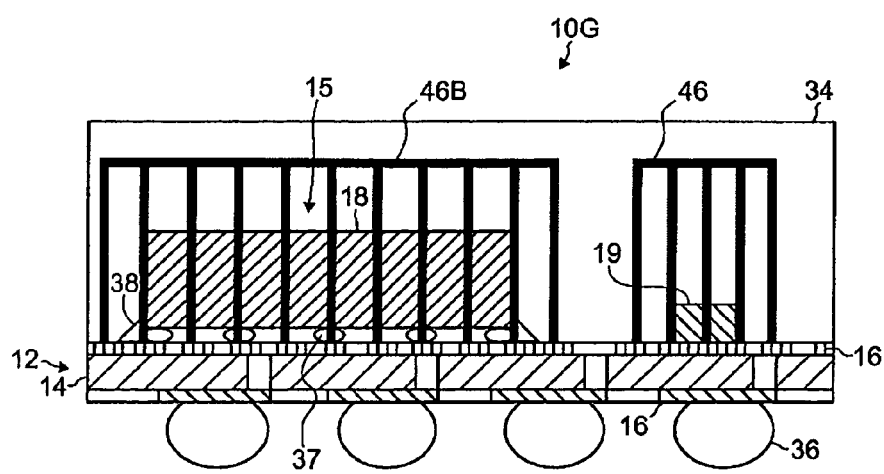
FIG. 8B is a cross-sectional view of another embodiment of the semiconductor device of the present invention.

Referring to FIGS. 8A-8B, another embodiment of the device 10G is shown. This embodiment is similar to the device 10F. In device 10G, multiple wire meshes 44 are formed to provide compartmental RF shielding for multiple components. As shown in FIGS. 8A and 8B, the device 10G has a substrate 12 having one or more metal traces 16 formed in an insulation layer 14 of the substrate 12. The device 10G has multiple components 15 electrically connected to the first surface of the substrate 12. The components 15 may be a die 18 and/or one or more passive components 19. Wire meshes 44 are formed to provide individual compartmental RF shielding to both the die 18 and passive component 19.

Each wire mesh 44 is formed of a plurality of metal wires. Each wire will extend across either the entire length or width of one of the components 15. Each end of each wire will be coupled to a metal trace 16 which is grounded thereby creating the wire mesh 44. In the present embodiment, a first set of wires 46A has a first end attached to a metal trace 16 on a first side of the component 15. The wire 46A extends widthwise over the component 15 to a second side of the component 15 where a second end of the wire 46A is attached to another metal trace 16. In a like manner, a second set of wires 46B has a first end attached to a metal trace 16 on a third side of the component 15. The wire 46B extends lengthwise over the component 15 to a fourth side of the component 15 where the second end of the wire 46B is attached to another metal trace 16. By adjusting the number of wires 46, pitch of the wires 46 and/or diameter of the wires 46, one may alter the shielding effect.

Figure 9:
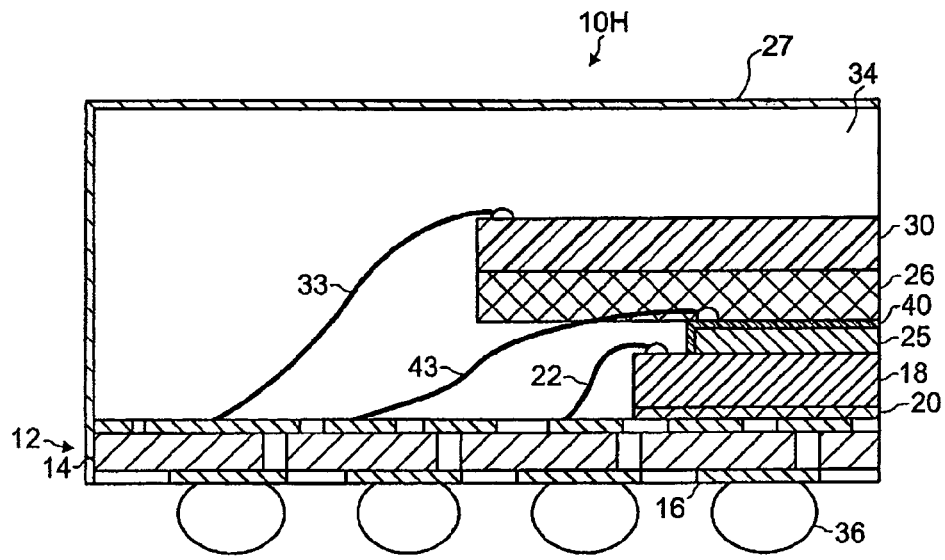
FIG. 9 is a cross-sectional view of another embodiment of the semiconductor device of the present invention.

Referring to FIG. 9, another embodiment of the device 10H is shown. In this embodiment, the device 10H has a substrate 12. The substrate 12 includes an insulation layer 14 having predetermined area and thickness. The insulation layer 14 will have one or more metal traces 16 formed thereon. The number of metal traces 16 is not limited to the number shown in FIG. 9. In general, the insulation layer 14 will have multiple layers of metal traces 16 formed therein. A die 18 is attached to the substrate 12. The die 18 may be an RF die, a memory die, a logic die, an ASIC die, and other like elements. In the embodiment shown in FIG. 9, an adhesive 20 is used to couple the second surface of the die 18 to the first surface of the substrate 12. The die 18 is then electrically coupled to the substrate 12 using one or more wirebonds 22. The wirebonds 22 will form an electrical connection between a bond pad formed on the first surface of the die 18 and metal traces 16 formed on the first surface of the substrate 12.

A passivation or dielectric layer 25 is applied to an active surface of the die 18. The passivation layer 25 is applied to the surface of the die 18 having the wirebonds 22. The passivation layer 25 is used to electrically isolate the active surface of the die 18 from the metal coating 40. A metal coating 40 is applied to the first surface of the die 18 over the passivation layer 25. The metal coating 40 may be formed of different metal materials such as Cu, Al or the like.

Wires 43 are attached to metal coating 40 and to the metal traces 16 formed on the first surface of the substrate 12. The wires 43 are positioned around the perimeter of the die 18. The listing of the above is given as examples and should not be seen as to limit the scope of the present invention.

The wires 43 connect the metal coating 40 to the metal traces 16. In general, the wires 43 are attached to the first surface of the metal coating 40 and to a metal trace 16 via bond pads. The metal trace 16 to which the wires 43 is attached is a ground pad thereby grounding the metal coating 40. The wires 43 positioned around the perimeter of the grounded metal coating 40 and attached to the grounded metal trace 16 isolates and forms an RF shield around the die 18. The number, pitch and diameter of the wires 43 may be changed to alter the shielding effect. Thus, the number of wires 43, the spacing between wires 43 and/or diameter of the wirebonds 43 may be increased to provide greater shielding coverage and lessened for devices that require less shielding.

The second die 30 may be coupled to the metal coating 40. The second die 30 is attached to the metal coating 40 using an adhesive 26. In this embodiment the second die 30 is larger than first die 18 so it requires either film on wire or an additional spacer to ensure clearance above the loop height of wires 43. However, the second die 30 could be small enough to fit between wire 43 bond pads, attached with standard methods such as an adhesive film, an epoxy, or the like. The second die 30 is then electrically connected to the substrate 12. As shown in FIG. 9, wirebonds 33 are used to electrically connect the second die 30 to metal traces 16 formed on the first surface of the substrate 12. The wirebonds 33 are generally attached to the first surface of the second die 30 and to a metal trace 16 via bond pads.

A mold compound 34 is used to encapsulate the device 10H. A conductive coating 27 may be applied to the device 10H. The conductive coating 27 is used to provide further EMI shielding for the device 10H. The conductive coating 27 may be applied by plating, vacuum printing, vacuum deposition, insert molding, spray coating, and the like. In accordance with one embodiment, the conductive coating 27 is a conformal shield. The conductive coating 27 is a metallic coating, which is attached to ground metal in the substrate to provide a full shielding result. A non-conductive coating (not shown) maybe applied to the conductive coating 27. The non-conductive coating is used to provide protection to the conductive coating 27.

A set of contacts 36 may be coupled to the second surface of the substrate 12. In the embodiment shown in FIG. 9, the contacts 36 are solder balls. If solder balls are used, the solder balls will be electrically coupled to the second surface of the substrate 12. In general, a reflow process may be used to couple the solder balls to the second surface of the substrate 12. Alternative methods may be used to couple different types of contacts to the first substrate 12 without departing from the spirit and scope of the present invention.

Figure 10:
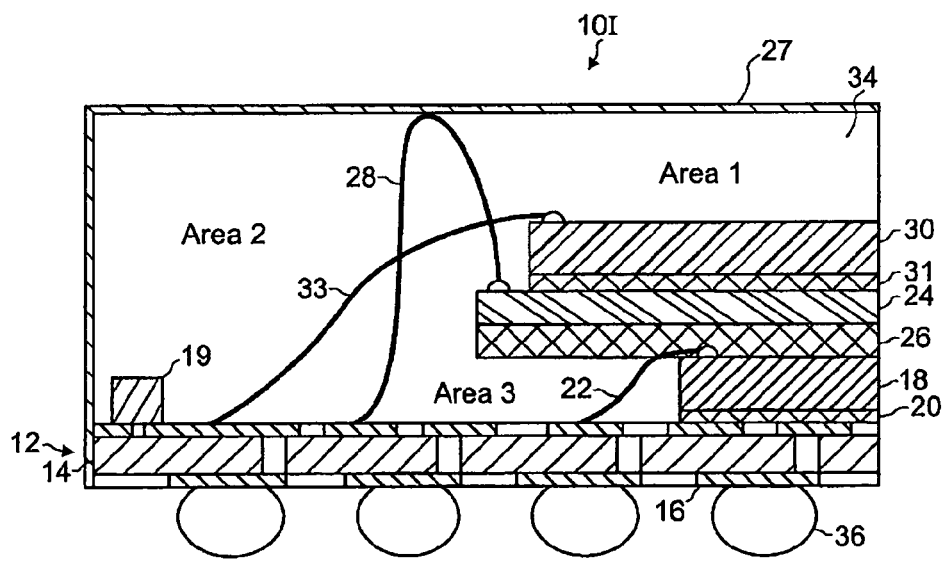
FIG. 10 is a cross-sectional view of another embodiment of the semiconductor device of the present invention.

Referring to FIG. 10, another embodiment of the device 10I is shown. In this embodiment, the device 10I has a substrate 12. The substrate 12 has an insulation layer 14. The insulation layer 14 has metal traces 16 formed on the first and second surface of the insulation layer 14. The number of metal traces 16 is not limited to the number shown in FIG. 10. A die 18 is attached to the substrate 12. The die 18 may be an RF die, a memory die, a logic die, an ASIC die, and other like elements. In the embodiment shown in FIG. 10, an adhesive 20 is used to couple the second surface of the die 18 to the first surface of the substrate 12. The adhesive 20 may be an adhesive film, an epoxy, or the like. The die 18 is then electrically coupled to the substrate 12. In the present embodiment, wirebonds 22 are used to electrically couple the die 18 to the substrate 12. The wirebond 22 will form an electrical connection between a bond pad formed as part of metal trace 16 on the first surface of the substrate 12 and a bond pad formed on the first surface of the die 18. Alternatively, the die 18 may be coupled to the substrate 12 through flip chip bonding, surface mount technology (SMT) or the like.

A spacer 24 is then attached to the first surface of the die 18. The spacer 24 may be a metalized spacer, a silicon spacer, or the like. In the embodiment depicted in FIG. 10, the spacer 24 is longer than the die 18. Thus, the spacer 24 will extend past both side surfaces of the die 18, the side surfaces being adjacent and approximately perpendicular to the first surface and second surface of the die 18. The spacer 24 is attached to the first surface of the die 18 using an adhesive 26. The adhesive may be an adhesive film, an epoxy, or the like. In the present embodiment, the spacer 24 needs to be attached to the first surface of the die 18 so that the spacer 24 does not come into contact with the wirebonds 22. Thus, the adhesive used to attach the second surface of the spacer 24 to the first surface of the die 18 needs to be thicker than the loop height of the wirebonds 22. In accordance with one embodiment of the present invention, a film on wire technology is used to attach the spacer 24 to the first surface of the die 18. In film on wire technology, an adhesive film 26 having a thickness greater then the loop height of the wirebonds 22 is used to attached the die 18 to the spacer 24.

A second set of wirebonds 28 are positioned around the perimeter of the spacer 24 and connects the spacer 24 to the first surface of the substrate 12. In the embodiment shown in FIG. 10, the wirebonds 28 are attached to the first surface of the spacer 24 and to a metal trace 16 formed on the first surface of the insulation layer 14 of the substrate 12. In general, the wirebonds 28 are attached to the first surface of the spacer 24 and to a metal trace 16 via bond pads. The number, pitch and diameter of the wirebonds 28 may be changed to alter the shielding effect. Thus, the number of wirebonds 28, the spacing between wirebonds 28 and/or diameter of the wirebonds 28 may be increased to provide greater shielding coverage and lessened for devices that require less shielding. The wirebonds 28 form a loop having a first height which will extend through a mold compound 34.

A second die 30 may be coupled to the first surface of the metalized spacer 24. The second die 30 may be a memory die, a logic die, an ASIC die, and other like elements. It should be noted that the listing of the above types of dies is given as an example and should not be seen as to limit the scope of the present invention. The second die 30 is generally attached to the first surface of the spacer 24 using an adhesive 31. The adhesive 31 may be an adhesive film, an epoxy, or the like. The second die 30 is positioned on the surface of the spacer 24 so as to not touch the wirebonds 28. In the embodiment depicted in FIG. 10, the length of the second die 30 is smaller than the length of the spacer 24. Thus, by positioning and attaching the second die 30 to a central area of the first surface of the spacer 24, the die 30 will not contact the wirebonds 28. The second die 30 is then electrically connected to the substrate 12. As shown in FIG. 10, wirebonds 33 are used to electrically connect the second die 30 to metal traces 16 formed on the first surface of the substrate 12.

A mold compound 34 is then used to encapsulate the device 10I. During the process of applying the mold compound 34, the top of loops formed by the wirebonds 28 are compressed by the mold tooling so that the top of the loops formed by the wirebonds 28 are exposed. A cleaning process may be performed to remove any mold compound 34 that may have formed on the top of the loops of the wirebonds 28. The cleaning process will clean the contact area of the wirebonds 28, resulting in increased contact area and reduced contact resistance between the wirebonds 28 and a conductive coating 27 to be applied. The cleaning process may be done by chemical removal process, a grinding process or other physical abrasion techniques, laser ablation, and the like. The listing of the above is given as examples and should not be seen as to apply to a specific embodiment or to limit the scope of the present invention.

A conductive coating 27 is then applied to the device 10I. The conductive coating 27 is used to provide EMI shielding for the device 10I. The conductive coating 27 may be applied by plating, vacuum printing, vacuum deposition, insert molding, spray coating, and the like. The conductive coating 27 is applied to the mold compound 34. The conductive coating 27 is applied so that the conductive coating 27 is in contact with the exposed portion of the top of the loop of the wirebonds 28. Thus, the semiconductor device 10I will have a conductive coating 27 that contacts grounded metal. In FIG. 10, the conductive coating 27 is a conformal coating.

By having the wirebonds 28 positioned around the perimeter of the spacer 24 and contacting the conductive coating 27, the wirebonds 28 will form different shielded compartments within the device 10I. As shown in FIG. 10, the device 10I has three different shielded compartments within the device 10I: Area 1 forming a shield around the second die 30; Area 2 between the wirebonds 28 and side surfaces of the device 10I, forming a shield around additional components whether a die or passive component as shown 19 are attached to the substrate 12; and Area 3 forming a shield around the first die 18.

A set of contacts 36 may be coupled to the second surface of the substrate 12. In the embodiment shown in FIG. 10, the contacts 36 are solder balls. If solder balls are used, the solder balls will be electrically coupled to the second surface of the substrate 12 via bond pads. In general, a reflow process may be used to couple the solder balls to the second surface of the substrate 12. Alternative methods may be used to couple different types of contacts to the first substrate 12 without departing from the spirit and scope of the present invention.

Figure 11:
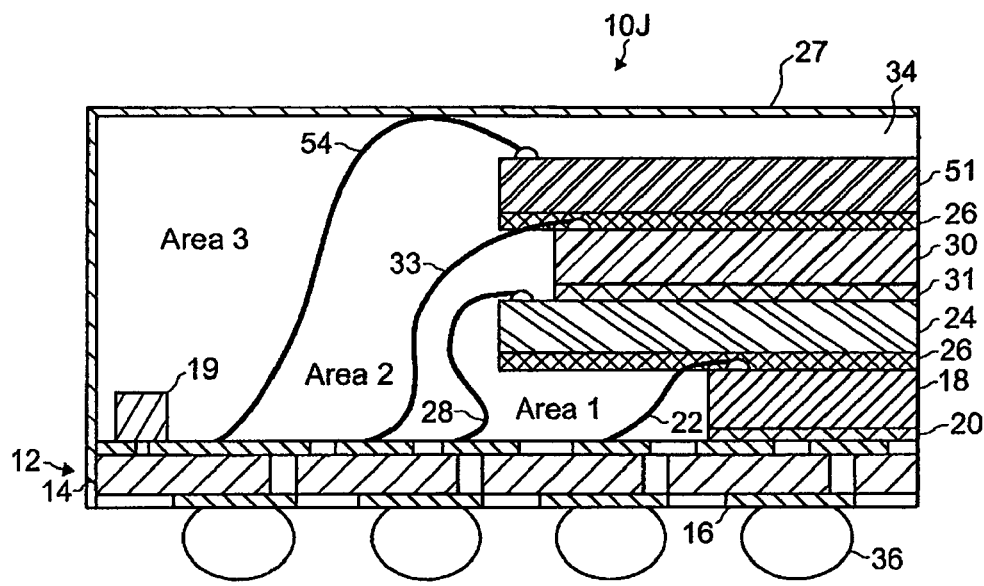
FIG. 11 is a cross-sectional view of another embodiment of the semiconductor device of the present invention.

Referring now to FIG. 11, another embodiment of the device 10J is shown. Device 10J is similar to device 10I. In device 10J, the substrate 12 has an insulation layer 14. The insulation layer 14 has metal traces 16 formed on the first and second surface of the insulation layer 14. The number of metal traces 16 is not limited to the number shown in FIG. 10. A die 18 is attached to the substrate 12. The die 18 may be an RF die, a memory die, a logic die, an ASIC die, and other like elements. In the embodiment shown in FIG. 11, an adhesive 20 is used to couple the second surface of the die 18 to the first surface of the substrate 12. The adhesive 20 may be an adhesive film, an epoxy, or the like. The die 18 is then electrically coupled to the substrate 12. In the present embodiment, wirebonds 22 are used to electrically couple the die 18 to the substrate 12. The wirebond 22 will form an electrical connection between a bond pad formed as part of metal trace 16 on the first surface of the substrate 12 and a bond pad formed on the first surface of the die 18. Alternatively, the die 18 may be coupled to the substrate 12 through flip chip bonding, surface mount technology (SMT) or the like.

A spacer 24 is then attached to the first surface of the die 18. The spacer 24 may be a metalized spacer, a silicon spacer, or the like. In the embodiment depicted in FIG. 11, the spacer 24 is longer than the die 18. Thus, the spacer 24 will extend past both side surfaces of the die 18, the side surfaces being adjacent and approximately perpendicular to the first surface and second surface of the die 18. The spacer 24 is attached to the first surface of the die 18 using an adhesive 26. The adhesive may be an adhesive film, an epoxy, or the like. In the present embodiment, the spacer 24 needs to be attached to the first surface of the die 18 so that the spacer 24 does not come into contact with the wirebonds 22. Thus, the adhesive used to attach the second surface of the spacer 24 to the first surface of the die 18 needs to be thicker than the loop height of the wirebonds 22. In accordance with one embodiment of the present invention, a film on wire technology is used to attach the spacer 24 to the first surface of the die 18. In film on wire technology, an adhesive film 26 having a thickness greater than the loop height of the wirebonds 22 is attached to the second surface of the spacer 24.

A second set of wirebonds 28 are positioned around the perimeter of the spacer 24 and connects the spacer 24 to the first surface of the substrate 12. In the embodiment shown in FIG. 11, the wirebonds 28 are attached to the first surface of the spacer 24 and to a metal trace 16 formed on the first surface of the insulation layer 14 of the substrate 12. In general, the wirebonds 28 are attached to the first surface of the spacer 24 and to a metal trace 16 via bond pads. The number, pitch and diameter of the wirebonds 28 may be changed to alter the shielding effect. Thus, the number of wirebonds 28, the spacing between wirebonds 28 and/or diameter of the wirebonds 28 may be increased to provide greater shielding coverage and lessened for devices that require less shielding.

A second die 30 may be coupled to the first surface of the metalized spacer 24. The second die 30 may be a memory die, a logic die, an ASIC die, and other like elements. It should be noted that the listing of the above types of dies is given as an example and should not be seen as to limit the scope of the present invention. The second die 30 is generally attached to the first surface of the spacer 24 using an adhesive 31. The adhesive 31 may be an adhesive film, an epoxy, or the like. The second die 30 is positioned on the surface of the spacer 24 so as to not touch the wirebonds 28. In the embodiment depicted in FIG. 11, the length of the second die 30 is smaller than the length of the spacer 24. Thus, by positioning and attaching the second die 30 to a central area of the first surface of the spacer 24, the die 30 will not contact the wirebonds 28. The second die 30 is then electrically connected to the substrate 12. As shown in FIG. 11, wirebonds 33 are used to electrically connect the second die 30 to metal traces 16 formed on the first surface of the substrate 12.

A second spacer 51 is attached to the first surface of the die 30. The spacer 51 may be a metalized spacer, a silicon spacer, or the like. In the embodiment depicted in FIG. 11, the spacer 51 is longer than the die 30. Thus, the spacer 51 will extend past both side surfaces of the die 30. The spacer 51 is attached to the first surface of the die 18 using an adhesive. The adhesive may be an adhesive film, an epoxy, or the like. In the present embodiment, the spacer 51 needs to be attached to the first surface of the die 30 so that the spacer 51 does not come into contact with the wirebonds 33. Thus, the adhesive used to attach the second surface of the spacer 24 to the first surface of the die 18 needs to be thicker than the loop height of the wirebonds 3. In accordance with one embodiment of the present invention, a film on wire technology is used to attach the spacer 24 to the first surface of the die 18. In accordance with one embodiment of the present invention, a film on wire technology uses an adhesive film 26 to attach the second surface of the second die 30 to the first surface of the metal coating 40.

A fourth set of wirebonds 54 are positioned around the perimeter of the spacer 51 and connects the spacer 51 to the first surface of the substrate 12. In the embodiment shown in FIG. 11, the wirebonds 54 are attached to the metalized first surface of the spacer 51 and to a metal trace 16 formed on the first surface of the insulation layer 14 of the substrate 12. In general, the wirebonds 54 are attached to the first surface of the spacer 51 and to a metal trace 16 via bond pads. The number, pitch and diameter of the wirebonds 54 may be changed to alter the shielding effect. Thus, the number of wirebonds 54, the spacing between wirebonds 54 and/or diameter of the wirebonds 54 may be increased to provide greater shielding coverage and lessened for devices that require less shielding. The wirebonds 54 form a loop having a height which will extend through a mold compound 34.

A mold compound 34 is then used to encapsulate the device 10J. During the process of applying the mold compound 34, the top of loops formed by the wirebonds 54 are compressed by the mold tooling so that the top of the loops formed by the wirebonds 54 are exposed. A cleaning process may be performed to remove any mold compound 34 that may have formed on the top of the loops of the wirebonds 54. The cleaning process will clean the contact area of the wirebonds 54, resulting in increased contact area and reduced contact resistance between the wirebonds 54 and a conductive coating 27 to be applied. The cleaning process may be done by chemical removal process, a grinding process or other physical abrasion techniques, laser ablation, and the like. The listing of the above is given as examples and should not be seen as to apply to a specific embodiment or to limit the scope of the present invention.

A conductive coating 27 is then applied to the device 10J. The conductive coating 27 is used to provide EMI shielding for the device 10J. The conductive coating 27 may be applied by plating, vacuum printing, vacuum deposition, insert molding, spray coating, and the like. The conductive coating 27 is applied to the mold compound 34. The conductive coating 27 is applied so that the conductive coating 27 is in contact with the exposed portion of the top of the loop of the wirebonds 54. Thus, the semiconductor device 10J will have a conductive coating 27 that contacts grounded metal. In FIG. 10, the conductive coating 27 is a conformal coating.

By having the wirebonds 54 positioned around the perimeter of the spacer 51 and contacting the conductive coating 27, the wirebonds 54 will form different shielded compartments within the device 10J. As shown in FIG. 11, the device 10J has three different shielded compartments within the device 10J.

A set of contacts 36 may be coupled to the second surface of the substrate 12. In the embodiment shown in FIG. 11, the contacts 36 are solder balls. If solder balls are used, the solder balls will be electrically coupled to the second surface of the substrate 12 via bond pads. In general, a reflow process may be used to couple the solder balls to the second surface of the substrate 12. Alternative methods may be used to couple different types of contacts to the first substrate 12 without departing from the spirit and scope of the present invention.

Figure 12:
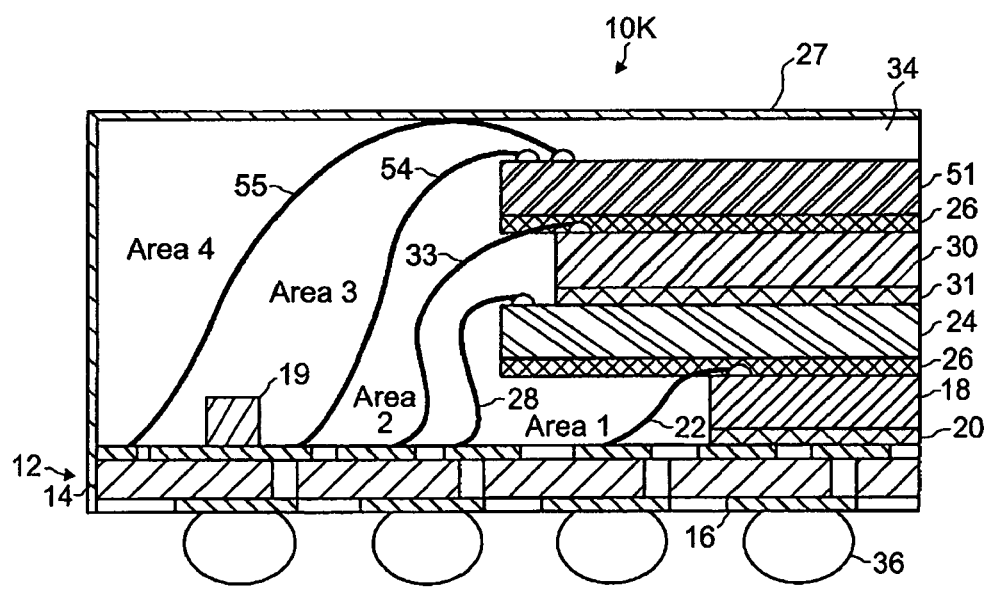
FIG. 12 is a cross-sectional view of another embodiment of the semiconductor device of the present invention.

Referring to FIG. 12, another embodiment of the device 10K is shown. Device 10K is similar to device 10J. In this embodiment, wirebonds 55 form a loop having a height which will extend through a mold compound 34.

Referring to FIG. 12, another embodiment of the device 10K is shown. Device 10K is similar to device 10J. In the embodiment shown in FIG. 12, the wirebonds 54 do not extend through a mold compound 34. In the embodiment shown in FIG. 12, the wirebonds 54 are attached to the first surface of the spacer 51 and to a metal trace 16 formed on the first surface of the insulation layer 14 of the substrate 12. In general, the wirebonds 54 are attached to the first surface of the spacer 51 and to a metal trace 16 via bond pads. Another set of wirebonds 55 are positioned around the perimeter either in line or internal (as shown) to wirebonds 54 of the spacer 51 and connects the spacer 51 to the first surface of the substrate 12. The wirebonds 55 form loops wherein a top section of the loop is in contact with the conductive coating 27. The wirebonds 54 and 55 will form different shielded compartments within the device 10K. As shown in FIG. 12, the device 10K has four different shielded compartments. The number, pitch and diameter of the wirebonds 54 and 55 may be changed to alter the shielding effect. Thus, the number of wirebonds 54 and 55, the spacing between wirebonds 54 and 55 and/or diameter of the wirebonds 54 and 55 may be increased to provide greater shielding coverage and lessened for devices that require less shielding.

Figure 13:
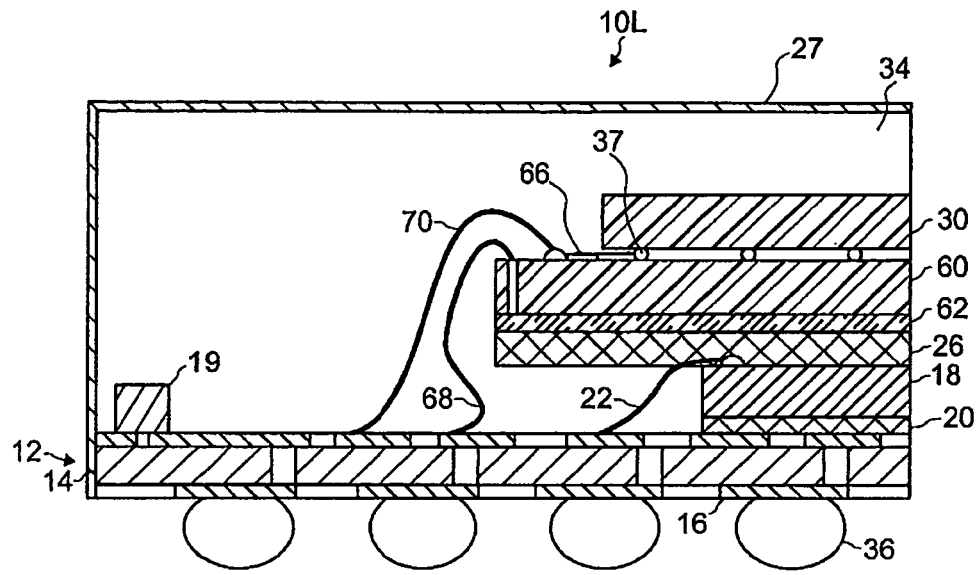
FIG. 13 is a cross-sectional view of another embodiment of the semiconductor device of the present invention.

Referring to FIG. 13, another embodiment of the device 10L is shown. In this embodiment, the device 10L has a substrate 12. The substrate 12 has an insulation layer 14. The insulation layer 14 has metal traces 16 formed on the first and second surface of the insulation layer 14. The number of metal traces 16 is not limited to the number shown in FIG. 13. A die 18 is attached to the substrate 12. The die 18 may be an RF die, a memory die, a logic die, an ASIC die, and other like elements. In the embodiment shown in FIG. 13, an adhesive 20 is used to couple the second surface of the die 18 to the first surface of the substrate 12. The adhesive 20 may be an adhesive film, an epoxy, or the like. The die 18 is then electrically coupled to the substrate 12. In the present embodiment, wirebonds 22 are used to electrically couple the die 18 to the substrate 12. The wirebond 22 will form an electrical connection between a bond pad formed as part of metal trace 16 on the first surface of the substrate 12 and a bond pad formed on the first surface of the die 18. Alternatively, the die 18 may be coupled to the substrate 12 through flip chip bonding, surface mount technology (SMT) or the like.

The device 10L has an interposer 60. The interposer 60 will have an approximately planer first and second surfaces. A metal layer 62 may be formed on the second surface. A plurality of vias 64 may be formed through the first surface of the interposer 60 to the metal layer 62. The vias 64 may have a metal coating or be metal filled. The interposer 60 may be patterned having a plurality of metal traces 66 formed thereon.

The interposer 60 is attached to the die 18. In the present embodiment, the interposer 60 is longer than the die 18. Thus, the interposer 60 will extend past both side surfaces of the die 18, the side surfaces being adjacent and approximately perpendicular to the first surface and second surface of the die 18. The interposer 60 is attached to the first surface of the die 18 using an adhesive. The adhesive may be an adhesive film, an epoxy, or the like. In the present embodiment, the interposer 60 needs to be attached to the first surface of the die 18 so that the interposer 60 does not come into contact with the wirebonds 22. Thus, the adhesive used to attach the metal layer second surface of the interposer 60 to the first surface of the die 18 needs to be thicker than the loop height of the wirebonds 22. In accordance with one embodiment of the present invention, a film on wire technology is used to attach the interposer 60 to the first surface of the die 18. In film on wire technology, an adhesive film 26 having a thickness greater than the loop height of the wirebonds 22 is used to attached the die 18 to the spacer 24.

A set of wirebonds 68 are positioned around the perimeter of the interposer 60 and are connected to the metal layer 62 through the vias 64. The wirebonds 68 connects the interposer 60 to the first surface of the substrate 12. The wirebonds 68 will be grounded on both ends forming a shield. The number, pitch and diameter of the wirebonds 68 may be changed to alter the shielding effect. Thus, the number of wirebonds 68, the spacing between wirebonds 68 and/or diameter of the wirebonds 68 may be increased to provide greater shielding coverage and lessened for devices that require less shielding.

A second die 30 may be coupled to the first surface of the interposer 60. The second die 30 may be a memory die, a logic die, an ASIC die, and other like elements. It should be noted that the listing of the above types of dies is given as an example and should not be seen as to limit the scope of the present invention. In the embodiment shown, the second die 30 is a attached to the first surface of the interposer 60 through flip chip technology. Thus a plurality of contacts 37 such as solder bumps are used to attach the second die 30 to the first surface of the interposer 60.

Wirebonds 70 are used to electrically connect the second die 30 to metal traces 16 formed on the first surface of the substrate 12. The wirebonds 70 are attached the metal traces 66 formed on the first surface of the interposer 60. The metal traces 66 connect the wirebonds 70 to solder bumps 37 of the second die 30. In the embodiment shown in FIG. 13, the wirebonds 70 are attached to the first surface of the interposer 60 and to a metal trace 16 formed on the first surface of the insulation layer 14 of the substrate 12 via bond pads.

A mold compound 34 is used to encapsulate the device 10L. The mold compound 34 is mainly made of epoxy and may provide underfill insulation around solder bumps 37. The mold compound 34 may or may not include a conformal shield layer 27.

A set of contacts 36 may be coupled to the second surface of the substrate 12. In the embodiment shown in FIG. 13, the contacts 36 are solder balls. If solder balls are used, the solder balls will be electrically coupled to the second surface of the substrate 12 via bond pads. In general, a reflow process may be used to couple the solder balls to the second surface of the substrate 12. Alternative methods may be used to couple different types of contacts to the first substrate 12 without departing from the spirit and scope of the present invention.

Figure 14:
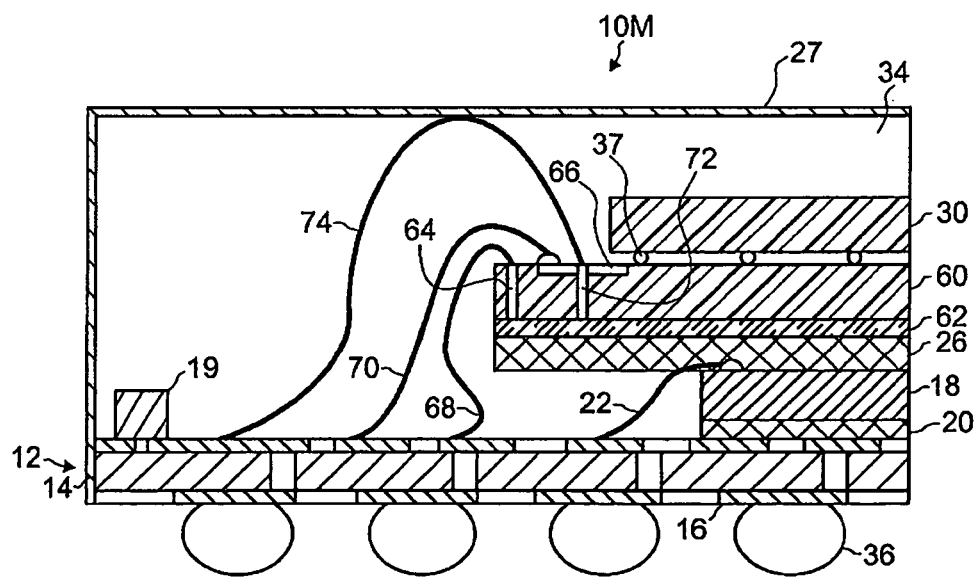
FIG. 14 is a cross-sectional view of another embodiment of the semiconductor device of the present invention.

Referring to FIG. 14, another embodiment of the device 10M is shown. The device 10M is similar to device 10L. In device 10M, additional vias 72 may be formed through the first surface of the interposer 60 to the metal layer 62. The vias 72 may have a metal coating or be metal filled. Wirebonds 74 are positioned around the perimeter of the interposer 60 and are connected to the metal layer 62 through the vias 72. The wirebonds 74 connects the interposer 60 to the first surface of the substrate 12. The wirebonds 74 will be grounded on both ends forming a shield. The number, pitch and diameter of the wirebonds 74 may be changed to alter the shielding effect. Thus, the number of wirebonds 74, the spacing between wirebonds 74 and/or diameter of the wirebonds 74 may be increased to provide greater shielding coverage and lessened for devices that require less shielding. The wirebonds 74 form a loop having a first height which will extend through a mold compound 34.

A mold compound 34 is then used to encapsulate the device 10M. During the process of applying the mold compound 34, the top of loops formed by the wirebonds 74 are compressed by the mold tooling so that the top of the loops formed by the wirebonds 74 are exposed. A cleaning process may be performed to remove any mold compound 34 that may have formed on the top of the loops of the wirebonds 74. The cleaning process will clean the contact area of the wirebonds 74, resulting in increased contact area and reduced contact resistance between the wirebonds 74 and a conductive coating 27 to be applied. The cleaning process may be done by chemical removal process, a grinding process or other physical abrasion techniques, laser ablation, and the like. The listing of the above is given as examples and should not be seen as to apply to a specific embodiment or to limit the scope of the present invention.

A conductive coating 27 is then applied to the device 10M. The conductive coating 27 is used to provide EMI shielding for the device 10M. The conductive coating 27 may be applied by plating, vacuum printing, vacuum deposition, insert molding, spray coating, and the like. The conductive coating 27 is applied to the mold compound 34. The conductive coating 27 is applied so that the conductive coating 27 is in contact with the exposed portion of the top of the loop of the wirebonds 74. Thus, the semiconductor device 10M will have a conductive coating 27 that contacts grounded metal. In FIG. 14, the conductive coating 27 is a conformal coating. A non-conductive coating (not shown) maybe applied to the conductive coating. The non-conductive coating is used to protect the conductive coating 27.

By having the wirebonds 74 positioned around the perimeter of the interposer 60 and contacting the conductive coating 27, the wirebonds 74 will form different shielded compartments within the device 10M.

Figure 15:
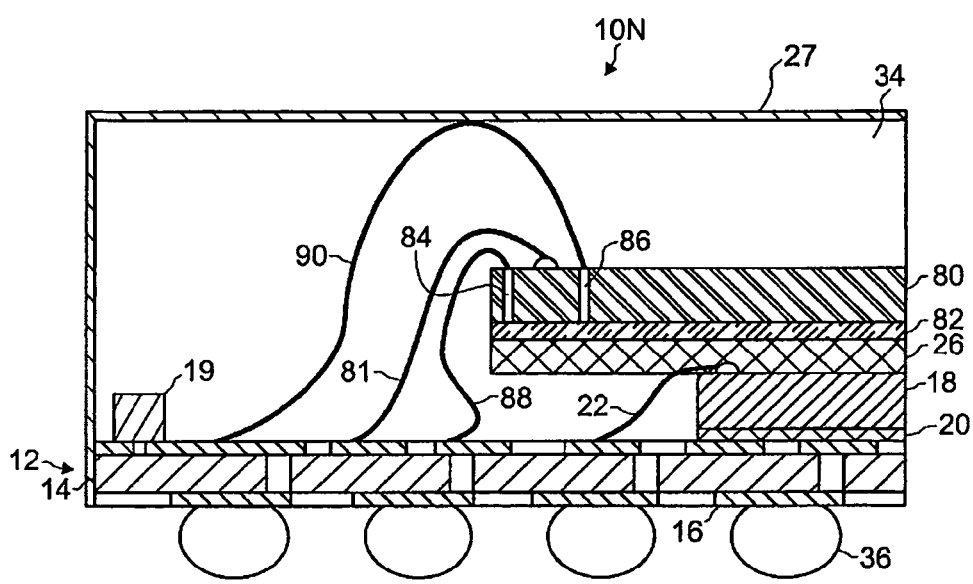
FIG. 15 is a cross-sectional view of another embodiment of the semiconductor device of the present invention.

Referring to FIG. 15, another embodiment of the device 10N is shown. In this embodiment, the device 10N has a substrate 12. The substrate 12 has an insulation layer 14. The insulation layer 14 has metal traces 16 formed on the first and second surface of the insulation layer 14. The number of metal traces 16 is not limited to the number shown in FIG. 10. A die 18 is attached to the substrate 12. The die 18 may be an RF die, a memory die, a logic die, an ASIC die, and other like elements. In the embodiment shown in FIG. 15, an adhesive 20 is used to couple the second surface of the die 18 to the first surface of the substrate 12. The adhesive 20 may be an adhesive film, an epoxy, or the like. The die 18 is then electrically coupled to the substrate 12. In the present embodiment, wirebonds 22 are used to electrically couple the die 18 to the substrate 12. The wirebond 22 will form an electrical connection between a bond pad formed as part of metal trace 16 on the first surface of the substrate 12 and a bond pad formed on the first surface of the die 18. Alternatively, the die 18 may be coupled to the substrate 12 through flip chip bonding, surface mount technology (SMT) or the like.

A second die 80 will have an approximately planer first and second surfaces. A metal layer 82 may be formed on the second surface of the second die 80. A first plurality of vias 84 may be formed through the first surface of the second die 80 to the metal layer 82. The vias 84 may have a metal coating or be metal filled. A second plurality of vias 86 may also be formed through the first surface of the second die 80 to the metal layer 82. The vias 86 may have a metal coating or be metal filled.

The second die 80 is attached to the die 18. In the present embodiment, the second die 80 is longer than the die 18. Thus, the second die 80 will extend past both side surfaces of the die 18, the side surfaces being adjacent and approximately perpendicular to the first surface and second surface of the die 18. The second die 80 is attached to the first surface of the first die 18 using an adhesive. The adhesive may be an adhesive film, an epoxy, or the like. In the present embodiment, the second die 80 needs to be attached to the first surface of the die 18 so that the second die 80 does not come into contact with the wirebonds 22. Thus, the adhesive used to attach the metal layer 82 on second surface of the second die 80 to the first surface of the die 18 needs to be thicker than the loop height of the wirebonds 22. In accordance with one embodiment of the present invention, a film on wire technology is used to attach the metal layer 82 on the second die 80 to the first surface of the die 18. In film on wire technology, an adhesive film 26 having a thickness greater than the loop height of the wirebonds 22 is used to attach the die 18 to the metal layer 82 on the second die 80. Wirebonds 81 are used to electrically connect the second die 30 to metal traces 16 formed on the first surface of the substrate 12

A set of wirebonds 88 are positioned around the perimeter of the second die 80 and are connected to the metal layer 82 through the vias 84. The wirebonds 88 connects the metal layer 82 to the first surface of the substrate 12. In the embodiment shown in FIG. 15, the wirebonds 88 are attached to the vias 84 and to the metal trace 16 formed on the first surface of the insulation layer 14 of the substrate 12 via bond pads. The wirebonds 88 will be grounded on both ends forming a shield around a first area. The number, pitch and diameter of the wirebonds 88 may be changed to alter the shielding effect. Thus, the number of wirebonds 88, the spacing between wirebonds 88 and/or diameter of the wirebonds 88 may be increased to provide greater shielding coverage and lessened for devices that require less shielding.

A another set of wirebonds 90 are positioned around the perimeter of the second die 80 and are connected to the metal layer 82 through the vias 86. The wirebonds 90 connects the metal layer 82 to the first surface of the substrate 12. The wirebonds 90 will be grounded on both ends forming a shield around a first area. The number, pitch and diameter of the wirebonds 90 may be changed to alter the shielding effect. Thus, the number of wirebonds 90, the spacing between wirebonds 90 and/or diameter of the wirebonds 90 may be increased to provide greater shielding coverage and lessened for devices that require less shielding. The wirebonds 90 form a loop having a first height which will extend through a mold compound 34.

A mold compound 34 is then used to encapsulate the device 10N. During the process of applying the mold compound 34, the top of loops formed by the wirebonds 90 are compressed by the mold tooling so that the top of the loops formed by the wirebonds 90 are exposed. A cleaning process may be performed to remove any mold compound 34 that may have formed on the top of the loops of the wirebonds 90. The cleaning process will clean the contact area of the wirebonds 90, resulting in increased contact area and reduced contact resistance between the wirebonds 90 and a conductive coating 27 to be applied. The cleaning process may be done by chemical removal process, a grinding process or other physical abrasion techniques, laser ablation, and the like. The listing of the above is given as examples and should not be seen as to apply to a specific embodiment or to limit the scope of the present invention.

A conductive coating 27 is then applied to the device 10N. The conductive coating 27 is used to provide EMI shielding for the device 10N. The conductive coating 27 may be applied by plating, vacuum printing, vacuum deposition, insert molding, spray coating, and the like. The conductive coating 27 is applied to the mold compound 34. The conductive coating 27 is applied so that the conductive coating 27 is in contact with the exposed portion of the top of the loop of the wirebonds 90. Thus, the semiconductor device 10N will have a conductive coating 27 that contacts grounded metal. In FIG. 15, the conductive coating 27 is a conformal coating. A non-conductive coating (not shown) maybe applied to the conductive coating. The non-conductive coating is used to protect the conductive coating 27.

A set of contacts 36 may be coupled to the second surface of the substrate 12. In the embodiment shown in FIG. 15, the contacts 36 are solder balls. If solder balls are used, the solder balls will be electrically coupled to the second surface of the substrate 12 via bond pads. In general, a reflow process may be used to couple the solder balls to the second surface of the substrate 12. Alternative methods may be used to couple different types of contacts to the first substrate 12 without departing from the spirit and scope of the present invention This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor device comprising:
   a substrate;
   a first die electrically attached to a first surface of the substrate;
   a shield spacer having a first and second surface, the second surface of the shield spacer attached to a first surface of the first die;
   a plurality of wirebonds attached to the shield spacer and to the substrate; and
   a mold compound for encapsulating the first die, the shield spacer and the wirebonds;
   a conductive coating applied to the mold compound;
   wherein the plurality of wirebonds attached to the shield spacer and to the substrate form a loop, a portion of the loop exposed and contacting the conductive coating.

2. A semiconductor device in accordance with claim 1 wherein the plurality of wirebonds are positioned around an outer perimeter of the first die.

3. A semiconductor device in accordance with claim 1 further comprising:
   a shield spacer adhesive layer attached to the second surface of the shield spacer and to a first surface of the first die; and at least one first die wirebond to electrically couple the first die to the substrate;
wherein a height of the shield spacer adhesive layer is greater than a loop height of the at least one first die wirebond.

4. A semiconductor device in accordance with claim 1 further comprising:
a second die attached to the first surface of the shield spacer; and
at least one second die wirebond to electrically couple the second die to the substrate.

5. A semiconductor device in accordance with claim 4 further comprising:
a second die adhesive layer attached to the first surface of the shield spacer and to the second die;
wherein a height of the second adhesive layer is greater than a loop height of the at least one second die wirebond.

6. A semiconductor device in accordance with claim 1 wherein the plurality of wirebonds are attached to grounded metal traces formed on the substrate.

7. A semiconductor device in accordance with claim 1 wherein the first die is a flip chip.

8. A semiconductor device in accordance with claim 7 further comprising a shield spacer adhesive layer attached to the second surface of the shield spacer and to a first surface of the first die.

9. A semiconductor device in accordance with claim 7 further comprising:
a second die attached to the first surface of the shield spacer; and
at least one second die wirebond to electrically couple the second die to the substrate.

10. A semiconductor device in accordance with claim 9 further comprising:
a second die adhesive layer attached to the first surface of the shield spacer and to the second die;
wherein a height of the second adhesive layer is greater than a loop height of the at least one second die wirebond.

11. A semiconductor device in accordance with claim 1 further comprising:
a second die attached to the first surface of the shield spacer; and
at least one second die wirebond to electrically couple the second die to the substrate.

12. A semiconductor device in accordance with claim 1 further comprising:
a second die attached to the first surface of the shield spacer;
at least one second die wirebond to electrically couple the second die to the substrate;
a second shield spacer having a first and second surface, the second surface of the shield spacer attached to a first surface of the second die; and
a plurality of second shield spacer wirebonds attached to the second shield spacer and to the substrate and forming a loop, a portion of the loop exposed and contacting the conductive coating.

13. A semiconductor device in accordance with claim 1 further comprising:
a second die attached to the first surface of the shield spacer;
at least one second die wirebond to electrically couple the second die to the substrate;
a second shield spacer having a first and second surface, the second surface of the shield spacer attached to a first surface of the second die; and
a first plurality of second shield spacer wirebonds attached to the second shield spacer and to the substrate and forming a first shield; and
a second plurality of second shield spacer wirebonds attached to the second shield spacer and to the substrate and forming a second shield.

14. A semiconductor device comprising:
a substrate;
a first die electrically attached to a first surface of the substrate;
a shield spacer having a first and second surface, the second surface of the shield spacer attached to a first surface of the first die;
means attached to the shield spacer and to the substrate to form a RF shield;
a mold compound for encapsulating the first die, the shield spacer and the means for forming the RF shield; and
a conductive coating applied to the mold compound;
wherein the means attached to the shield spacer and to the substrate form a loop, a portion of the loop exposed and contacting the conductive coating.

15. A semiconductor device in accordance with claim 14 wherein the means are positioned around an outer perimeter of the first die to form the RF shield around the first die.

16. A semiconductor device in accordance with claim 14 further comprising:
a second die attached to the first surface of the shield spacer; and
at least one second die wirebond to electrically couple the second die to the substrate.

17. A semiconductor device in accordance with claim 14 wherein the means are attached to grounded metal traces formed on the substrate.

18. A semiconductor device in accordance with claim 14 further comprising:
a second die attached to the first surface of the shield spacer; and
at least one second die wirebond to electrically couple the second die to the substrate.

19. A semiconductor device in accordance with claim 14 further comprising:
a second die attached to the first surface of the shield spacer;
at least one second die wirebond to electrically couple the second die to the substrate;
a second shield spacer having a first and second surface, the second surface of the shield spacer attached to a first surface of the second die; and
a plurality of second shield spacer wirebonds attached to the second shield spacer and to the substrate and forming a loop, a portion of the loop exposed and contacting the conductive coating.

20. A semiconductor device comprising:
a substrate;
a first die electrically attached to a first surface of the substrate;
a shield spacer having a first and second surface, the second surface of the shield spacer attached to a first surface of the first die;
means attached to the shield spacer and to the substrate to form an RF shield;
a mold compound for encapsulating the first die, the shield spacer and the means attached to the shield spacer and to the substrate; and a conductive coating applied to the mold compound;

wherein the means attached to the shield spacer and to the substrate form a loop, a portion of the loop exposed and contacting the conductive coating.

21. A semiconductor device in accordance with claim 20 further comprising:

a second die attached to the first surface of the shield spacer;

at least one second die wirebond to electrically couple the second die to the substrate;

a second shield spacer having a first and second surface, the second surface of the shield spacer attached to a first surface of the second die; and a first plurality of second shield spacer wirebonds attached to the second shield spacer and to the substrate and forming a first shield; and a second plurality of second shield spacer wirebonds attached to the second shield spacer and to the substrate and forming a second shield.

* * * * *